(12) United States Patent
Sekiguchi et al.

(10) Patent No.: US 11,856,759 B2
(45) Date of Patent: Dec. 26, 2023

(54) SEMICONDUCTOR DEVICE AND METHOD OF MANUFACTURING SEMICONDUCTOR DEVICE

(71) Applicant: ROHM CO., LTD., Kyoto (JP)

(72) Inventors: Yushi Sekiguchi, Kyoto (JP); Yasunobu Hayashi, Kyoto (JP); Tadayuki Yamazaki, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 242 days.

(21) Appl. No.: 17/330,381

(22) Filed: May 25, 2021

(65) Prior Publication Data
US 2021/0375889 A1    Dec. 2, 2021

(30) Foreign Application Priority Data
May 26, 2020    (JP) .................................. 2020-091400

(51) Int. Cl.
*H10B 20/20*    (2023.01)

(52) U.S. Cl.
CPC .................................. *H10B 20/20* (2023.02)

(58) Field of Classification Search
CPC .... H10B 20/20; H10B 43/30; H01L 29/66833
See application file for complete search history.

(56) References Cited

U.S. PATENT DOCUMENTS

| | | | | |
|---|---|---|---|---|
| 7,053,437 B2 * | 5/2006 | Iwata | ................ | H01L 29/66833 257/314 |
| 7,265,408 B2 * | 9/2007 | Nakagawa | ............. | H10B 69/00 257/314 |
| 7,482,231 B2 * | 1/2009 | Lee | ................... | H01L 29/40117 438/303 |
| 8,154,070 B2 * | 4/2012 | Mizukoshi | ........ | H01L 29/66833 257/314 |

FOREIGN PATENT DOCUMENTS

JP    2005064295 A    3/2005

* cited by examiner

*Primary Examiner* — Allison Bernstein
(74) *Attorney, Agent, or Firm* — Rabin & Berdo, P.C.

(57) ABSTRACT

A semiconductor device includes: a semiconductor layer having a main surface; a first conductive type well region formed on a surface portion of the main surface of the semiconductor layer; a second conductive type source region formed on a surface portion of the well region; a second conductive type drain region formed on the surface portion of the well region at an interval from the source region; a planar gate structure formed on the main surface of the semiconductor layer so as to face a first conductive type channel region disposed between the source region and the drain region; and a memory structure disposed adjacent to a lateral side of the planar gate structure, and including an insulating film formed on the channel region and a charge storage film facing the channel region with the insulating film interposed between the charge storage film and the channel region.

17 Claims, 32 Drawing Sheets

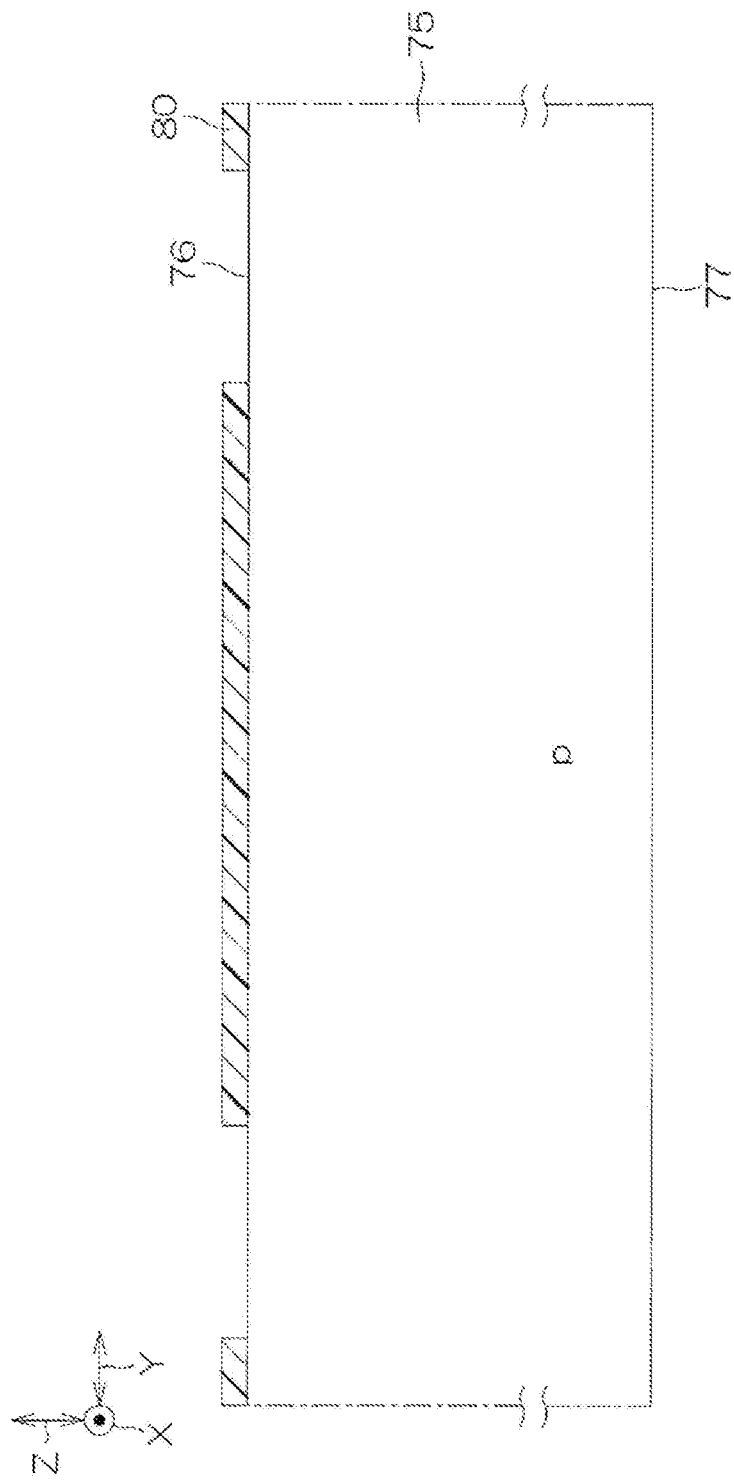

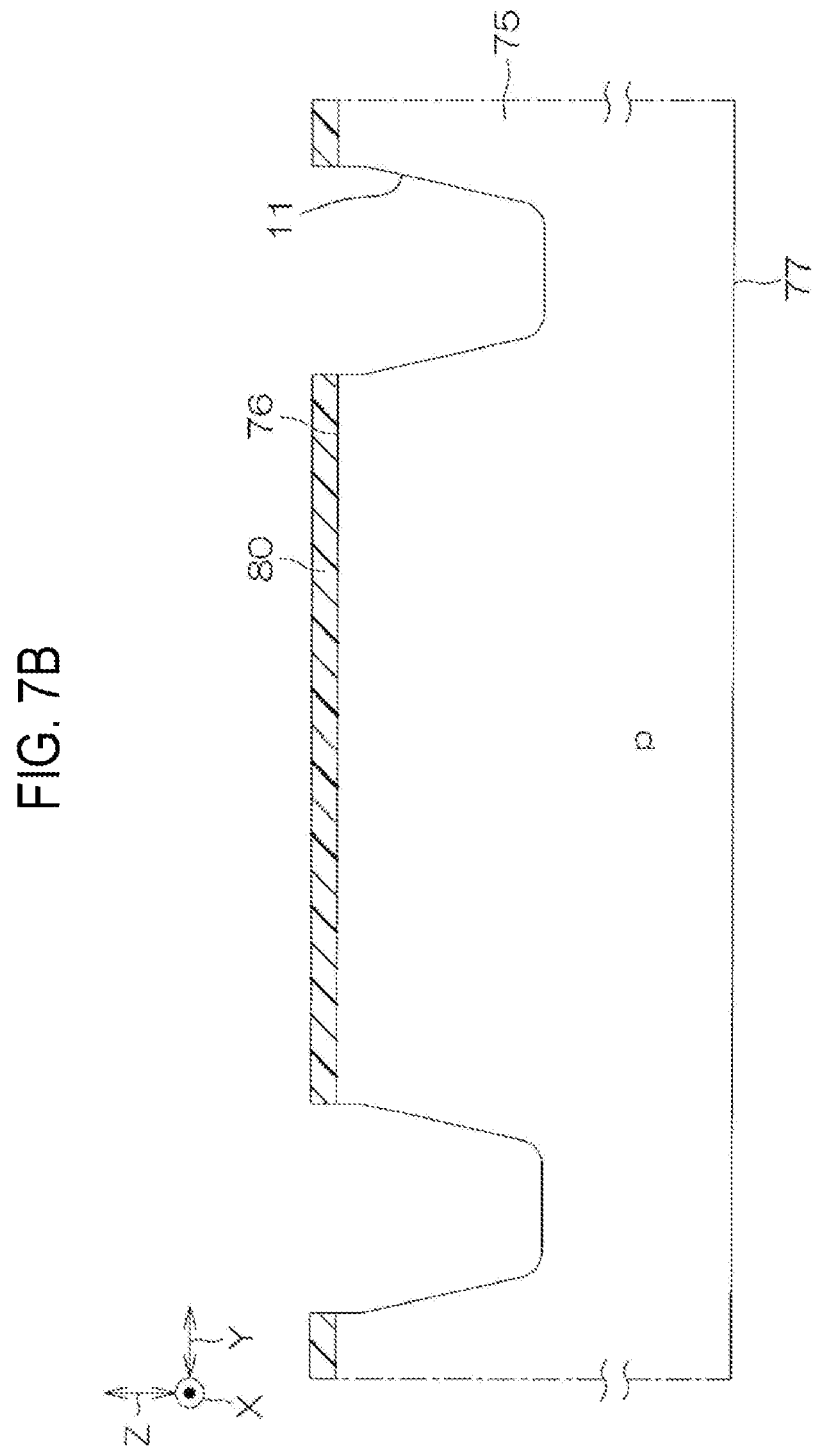

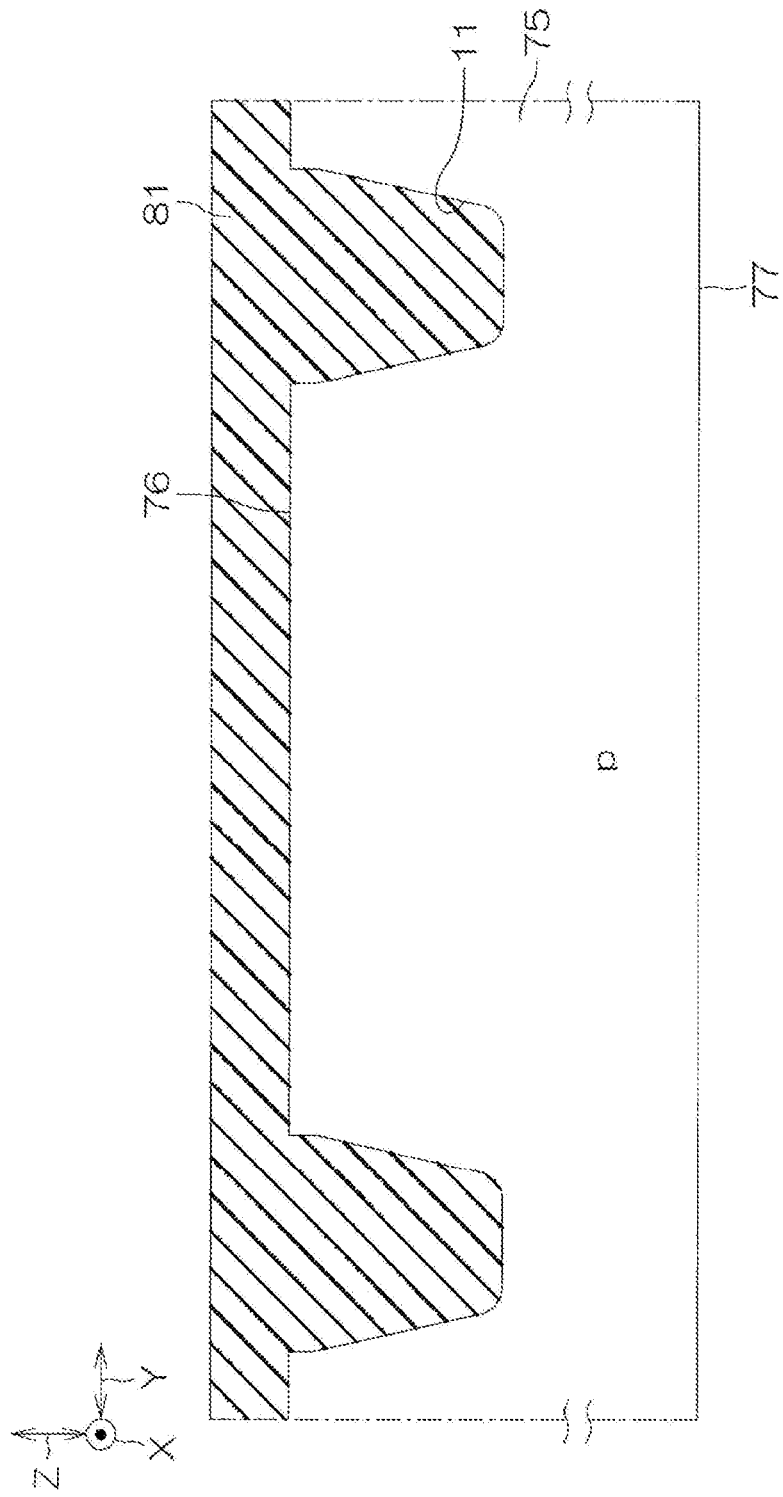

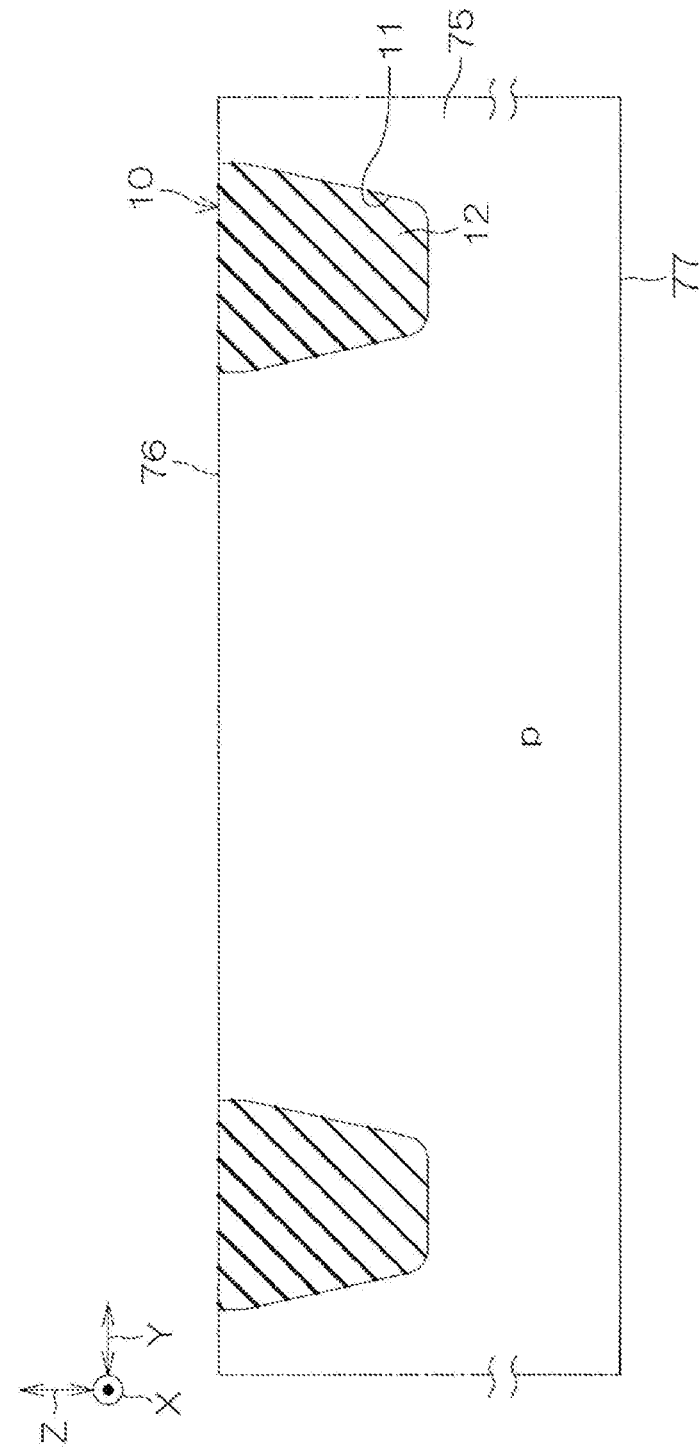

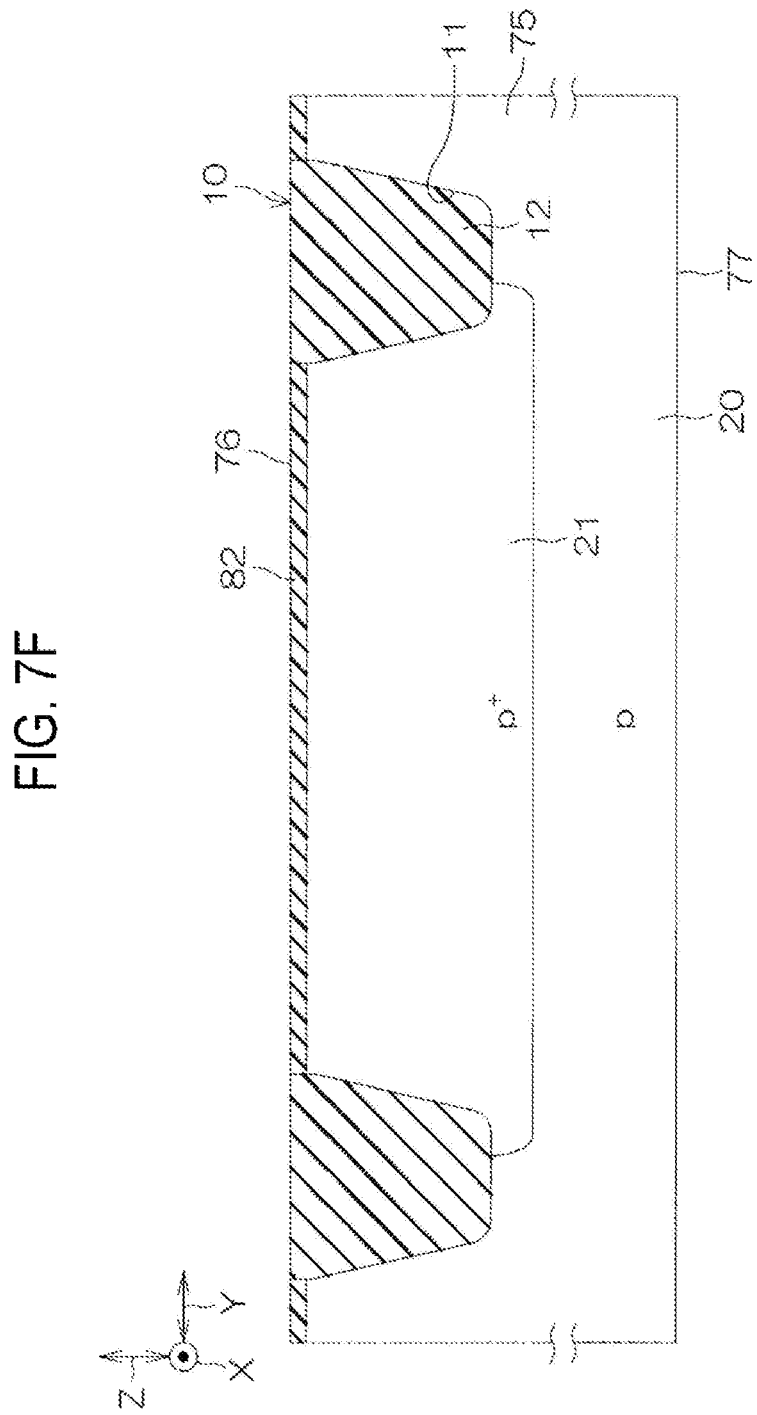

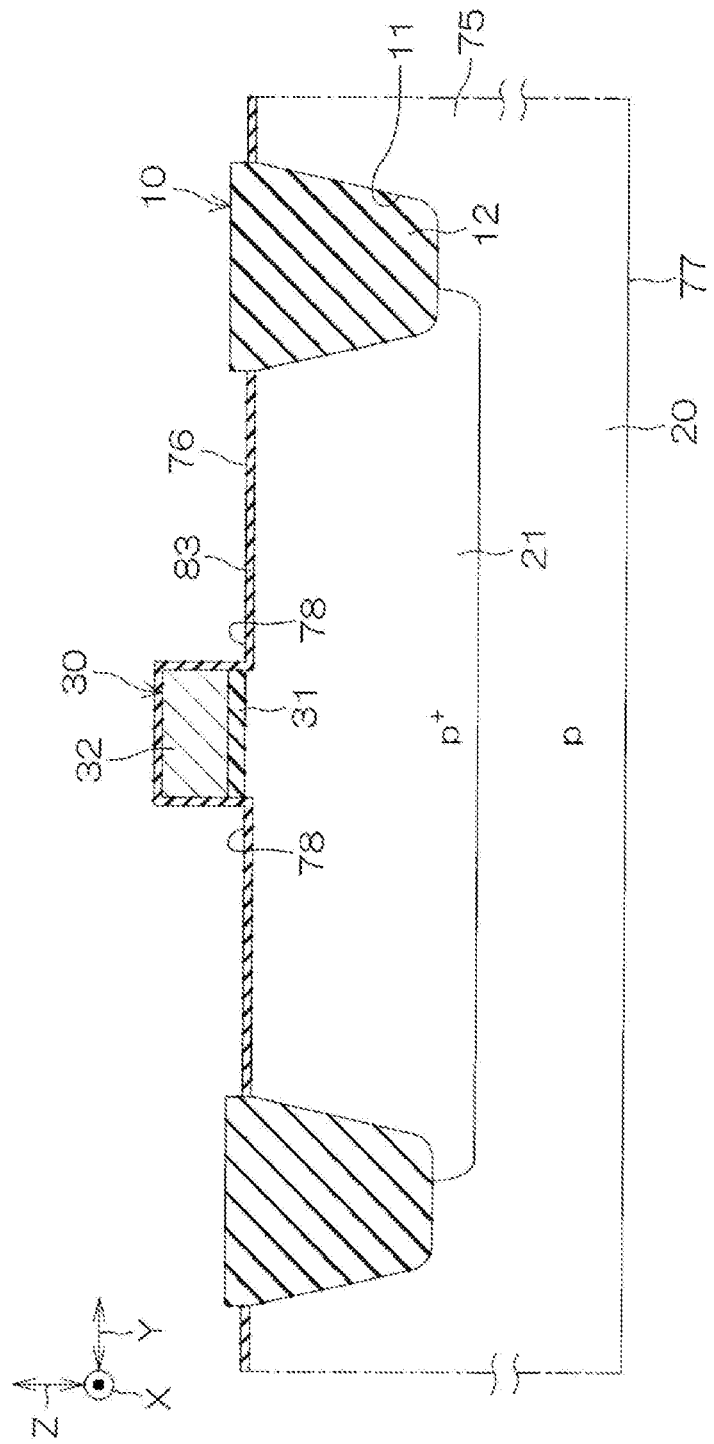

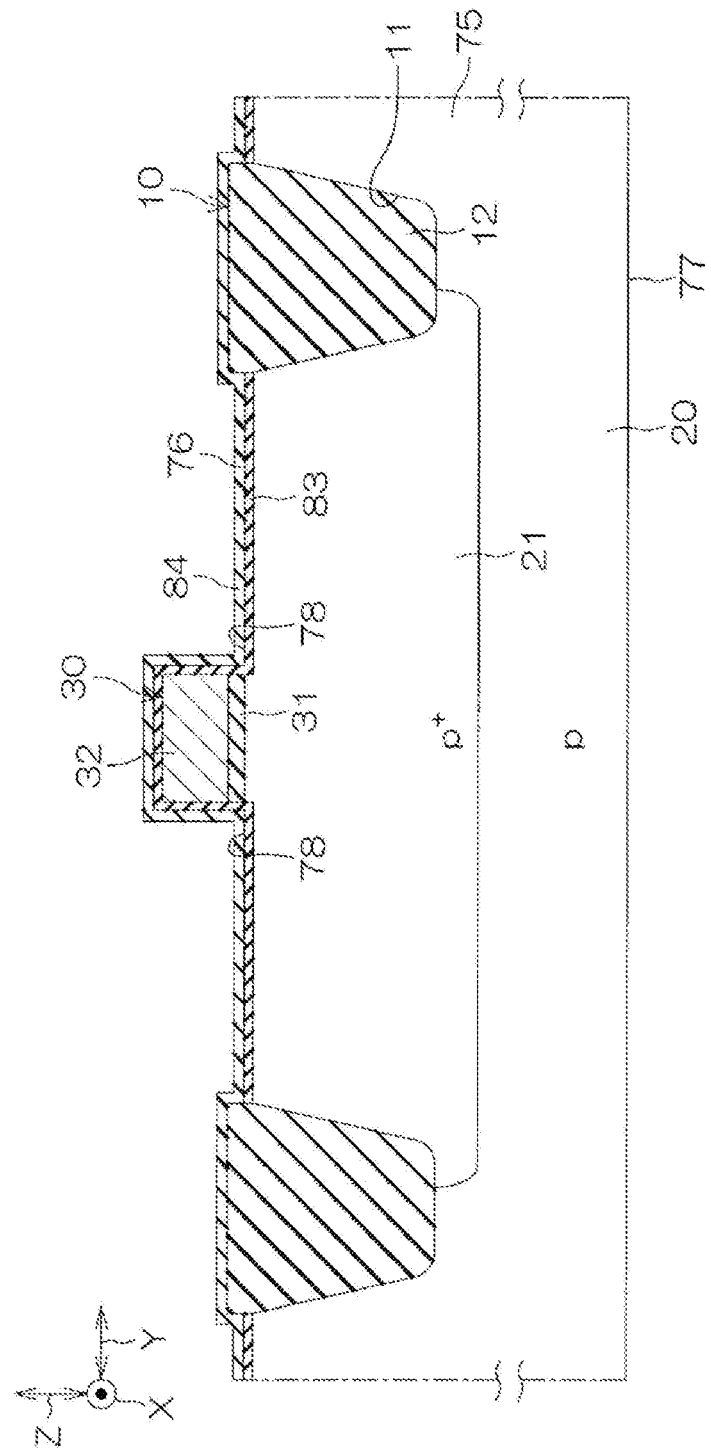

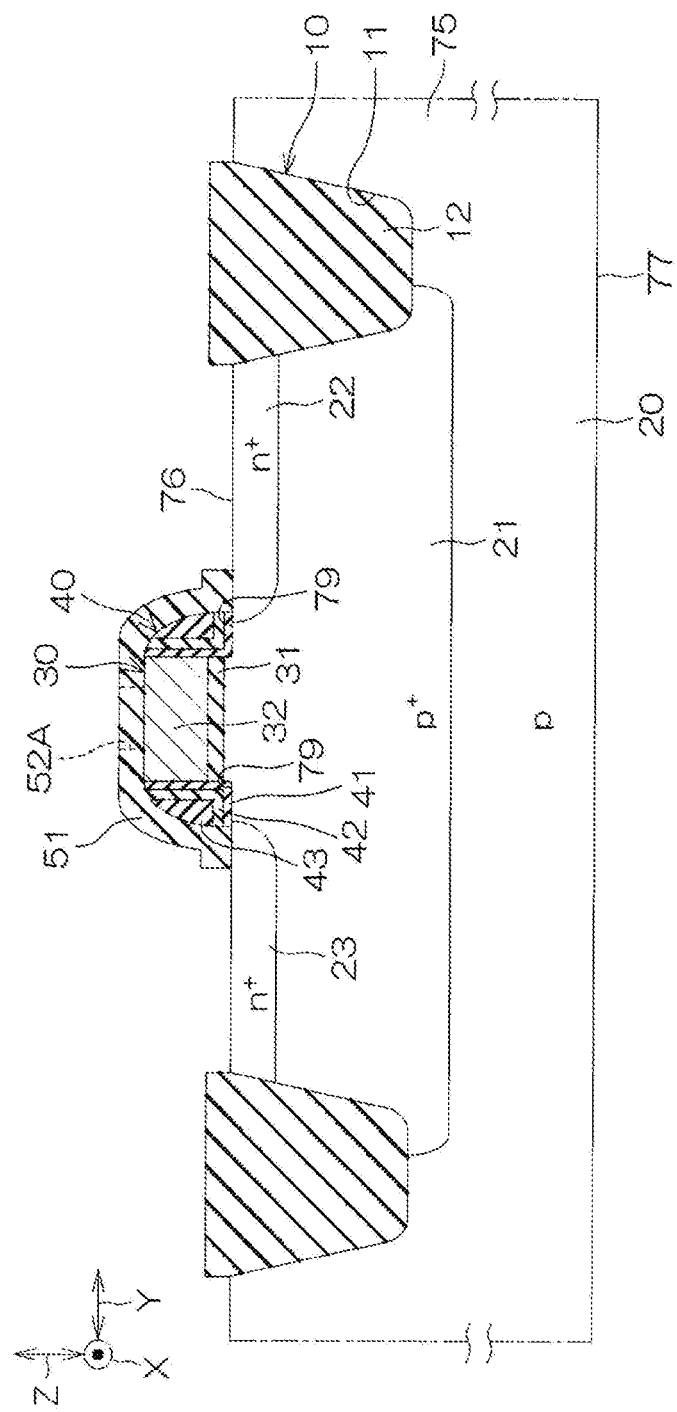

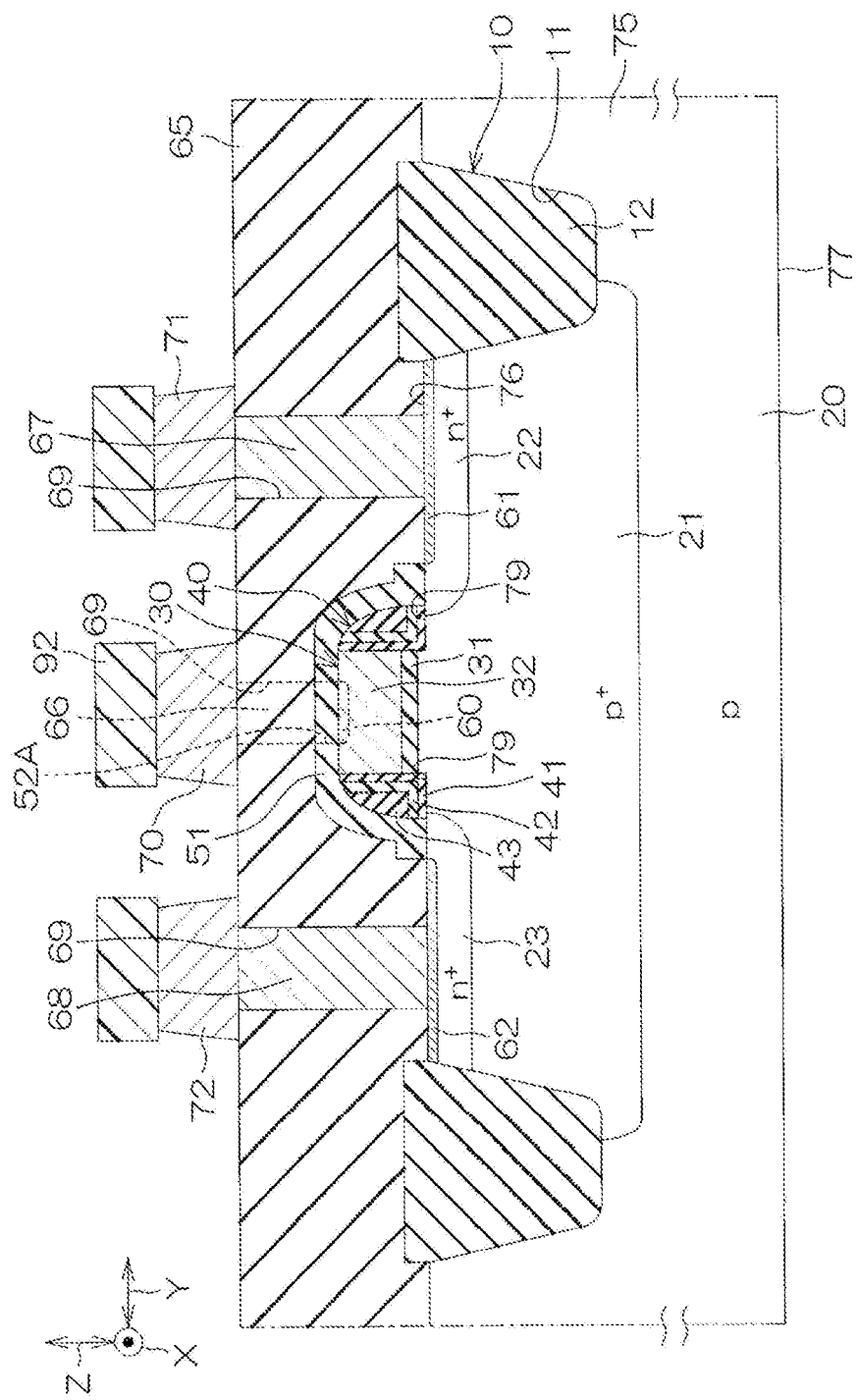

SEMICONDUCTOR DEVICE AND METHOD OF MANUFACTURING SEMICONDUCTOR DEVICE

CROSS-REFERENCE TO RELATED APPLICATION

This application is based upon and claims the benefit of priority from Japanese Patent Application No. 2020-091400, filed on May 26, 2020, the entire contents of which are incorporated herein by reference.

TECHNICAL FIELD

The present disclosure relates to a semiconductor device and a method of manufacturing a semiconductor device.

BACKGROUND

A semiconductor device provided with a non-volatile memory is known. In a memory cell provided in such a semiconductor device, a gate electrode is formed on a p-well region via a gate insulating film. On a lateral side of the gate electrode, a silicon oxide film, a silicon nitride film, and a silicon oxide film are sequentially laminated on a resistance change portion formed on a surface portion of the p-well region. In this memory cell, writing is performed by injecting hot electrons generated in a vicinity of a drain region into the silicon nitride film. Since this memory cell is used as an OTPROM (One Time Programmable Read Only Memory), no erase operation is performed except for a non-defective product confirmation test.

SUMMARY

Some embodiments of the present disclosure provide a semiconductor device capable of repeatedly writing and erasing data with respect to a memory structure in a configuration in which the memory structure is arranged adjacent to a lateral side of a planar gate structure, and a method of manufacturing such a semiconductor device.

An aspect of the present disclosure provides a semiconductor device including: a semiconductor layer having a main surface; a first conductive type well region formed on a surface portion of the main surface of the semiconductor layer; a second conductive type source region formed on a surface portion of the well region; a second conductive type drain region formed on the surface portion of the well region at an interval from the source region; a planar gate structure formed on the main surface of the semiconductor layer so as to face a first conductive type channel region disposed between the source region and the drain region; and a memory structure disposed adjacent to a lateral side of the planar gate structure, and including an insulating film formed on the channel region and a charge storage film facing the channel region with the insulating film interposed between the charge storage film and the channel region.

BRIEF DESCRIPTION OF DRAWINGS

FIG. 7A is a cross-sectional view for explaining an example of a method of manufacturing the semiconductor device.

FIG. 7B is a cross-sectional view showing a process after FIG. 7A.

FIG. 7C is a cross-sectional view showing a process after FIG. 7B.

FIG. 7D is a cross-sectional view showing a process after FIG. 7C.

FIG. 7F is a cross-sectional view showing a process after FIG. 7E.

FIG. 7I is a cross-sectional view showing a process after FIG. 7H.

FIG. 7K is a cross-sectional view showing a process after FIG. 7J.

FIG. 7L is a cross-sectional view showing a process after FIG. 7K.

FIG. 7O is a cross-sectional view showing a process after FIG. 7N.

FIG. 7R is a cross-sectional view showing a process after FIG. 7Q.

FIG. 7Y is a cross-sectional view showing a process after FIG. 7X.

DETAILED DESCRIPTION

Hereinafter, embodiments of the present invention will be described in detail with reference to the accompanying drawings.

Figure 1:
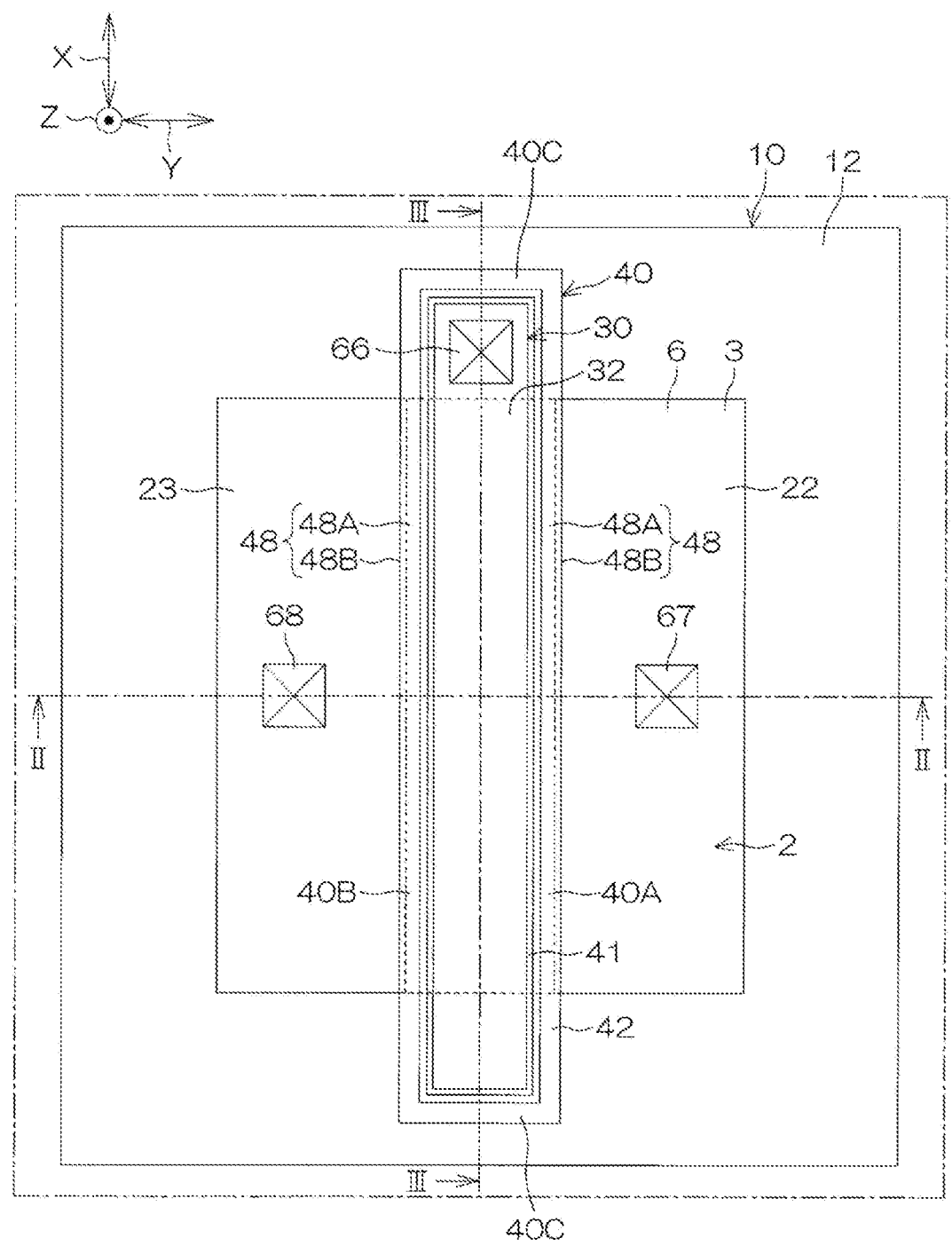
FIG. 1 is a plan view of a main part of a semiconductor device according to an embodiment of the present disclosure.
Figure 2:
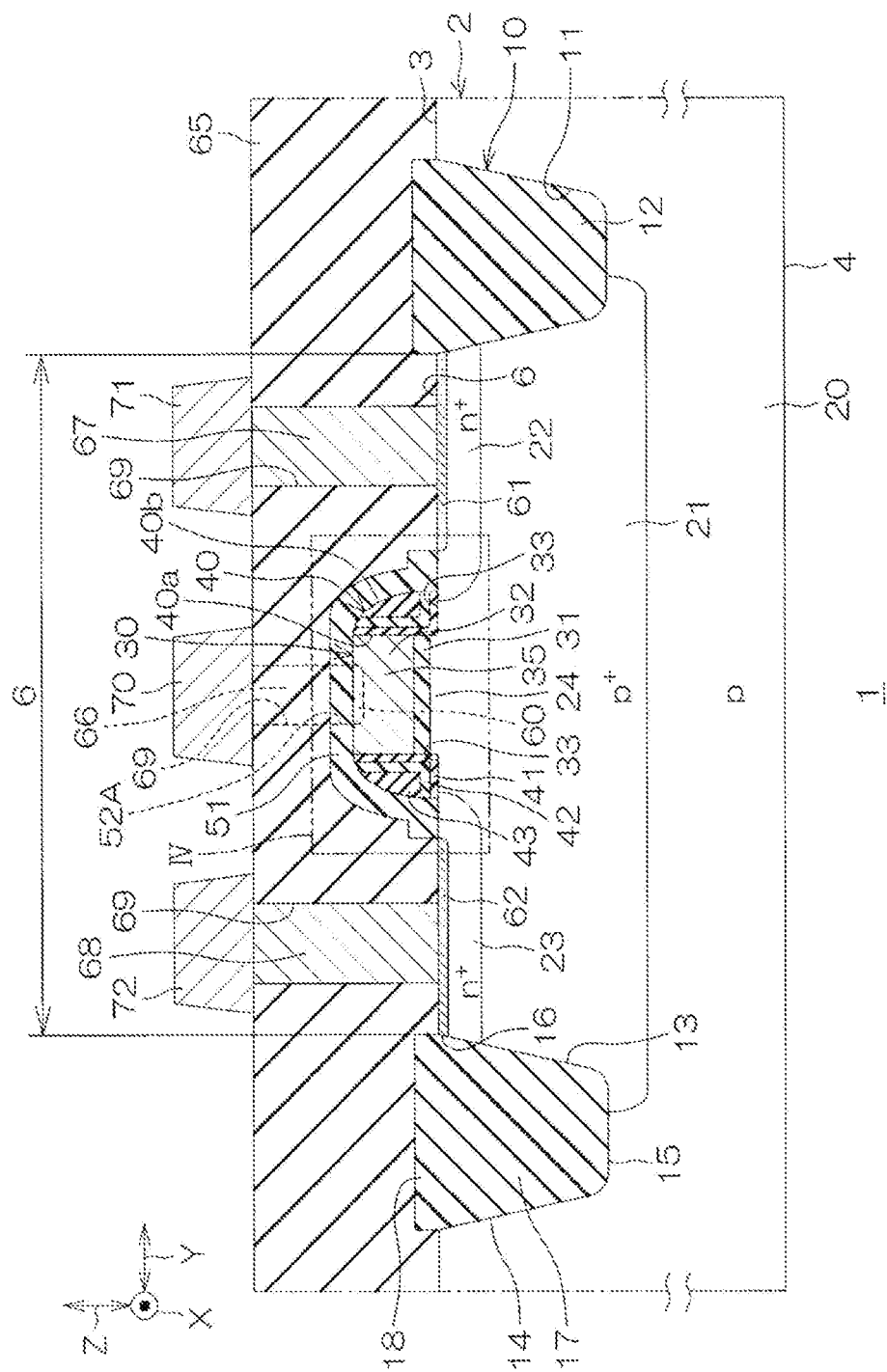
FIG. 2 is a cross-sectional view taken along line II-II shown in FIG. 1.
Figure 3:
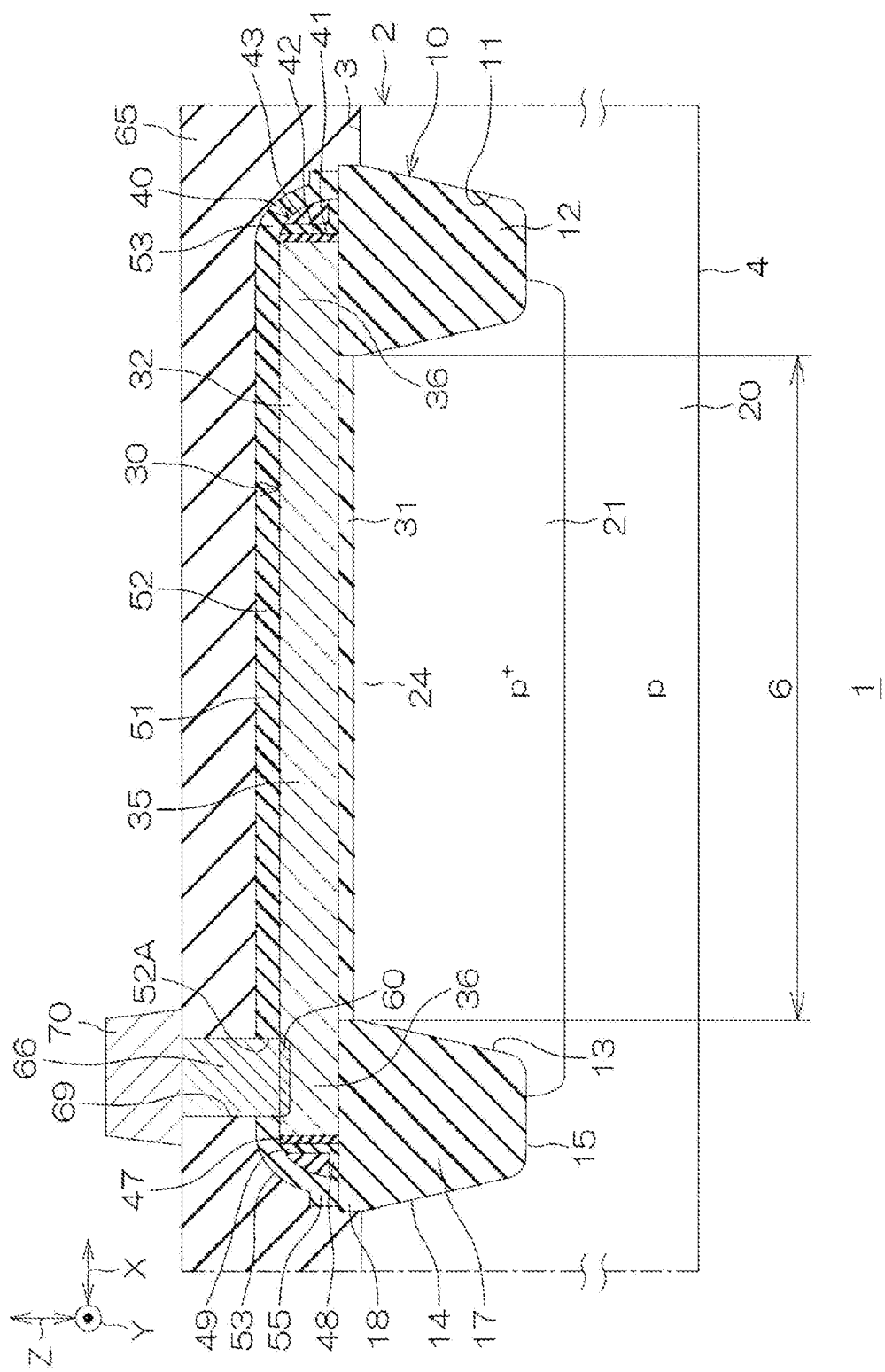
FIG. 3 is a cross-sectional view taken along line III-III shown in FIG. 1.
Figure 4:
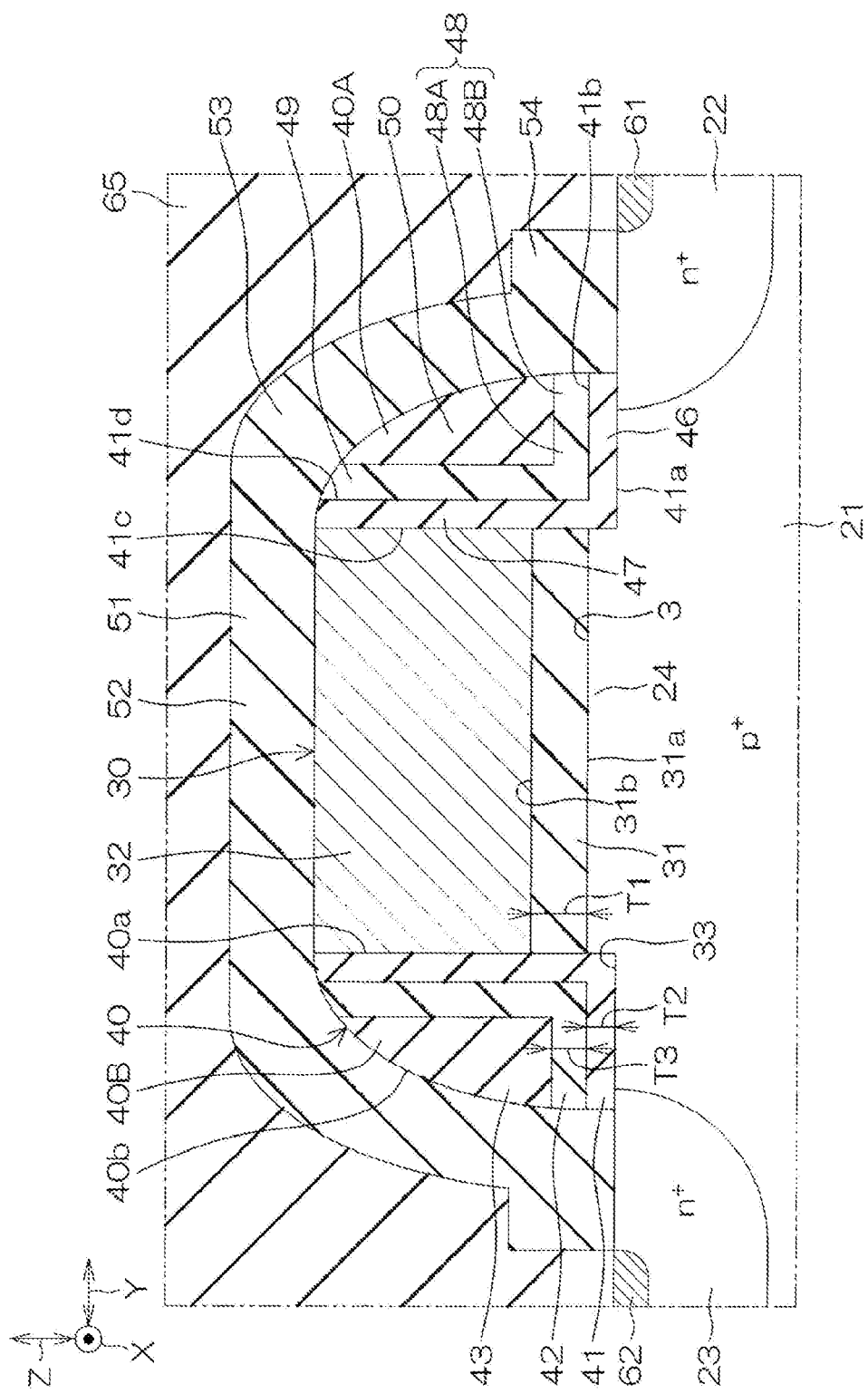
FIG. 4 is an enlarged view of region IV shown in FIG. 2.

FIG. 1 is a plan view of a main part of a semiconductor device 1 according to an embodiment of the present disclosure. FIG. 2 is a cross-sectional view taken along line II-II shown in FIG. 1. FIG. 3 is a cross-sectional view taken along line III-III shown in FIG. 1. FIG. 4 is an enlarged view of region IV shown in FIG. 2. In FIG. 1, an insulating spacer 43, a covering insulating film 51, and an interlayer insulating film 65, which will be described later, are removed. Hereinafter, a configuration of the semiconductor device 1 will be described with reference to FIGS. 1 to 4.

The semiconductor device 1 is a non-volatile memory that makes use of a MOSFET (Metal Oxide Semiconductor Field Effect Transistor). The semiconductor device 1 includes a semiconductor layer 2 formed of single crystalline Si.

Referring to FIG. 2, the semiconductor layer 2 is formed in a rectangular parallelepiped shape in the present embodiment. The semiconductor layer 2 has a first main surface 3 on one side and a second main surface 4 on the other side. The semiconductor device 1 includes a p-type (first conductive type) back gate region 20 formed on the semiconductor layer 2. The back gate region 20 is formed in the entire semiconductor layer 2.

The semiconductor device 1 includes a trench isolation structure 10 that defines a device region 6 in which a MOSFET is formed. The trench isolation structure 10 includes a trench 11 and an insulating buried object 12. The trench 11 is formed by digging the first main surface 3 toward the second main surface 4.

Referring to FIG. 1, the trench 11 is formed in a square ring shape in a plan view when viewed from a normal direction Z of the first main surface 3 and the second main surface 4 (hereinafter simply referred to as "in a plan view"), and defines the quadrangular device region 6. A direction in which one side of the device region 6 extends in a plan view is defined as a first direction X. A direction orthogonal to both the first direction X and the normal direction Z is defined as a second direction Y.

Referring to FIG. 2, the trench 11 specifically includes an inner side wall 13 on one side, an outer side wall 14 on the other side, and a bottom wall 15 connecting the inner side wall 13 and the outer side wall 14. The inner side wall 13 is formed in a square ring shape in a plan view. The outer side wall 14 is formed in a square ring shape extending parallel to the inner side wall 13 in a plan view. The outer side wall 14 does not necessarily have to extend parallel to the inner side wall 13, and may be formed in a shape different from that of the inner side wall 13. The bottom wall 15 extends parallel to the first main surface 3. The bottom wall 15 may be formed in a curved shape toward the second main surface 4.

In the present embodiment, the trench 11 is formed in a tapered shape in which an opening width narrows toward the bottom wall 15. A taper angle of the trench 11 may be more than 90 degrees and 125 degrees or less. The taper angle is desirably more than 90 degrees and 100 degrees or less. The taper angle of the trench 11 is an angle between the inner side wall 13 (outer side wall 14) of the trench 11 and the first main surface 3 in the semiconductor layer 2. Of course, the trench 11 may be formed perpendicular to the first main surface 3.

A depth of the trench 11 may be 0.1 µm or more and 1 µm or less. A width of the trench 11 is arbitrary. The width of the trench 11 may be 0.1 µm or more and 10 µm or less. The width of the trench 11 is defined by a width in a direction orthogonal to a direction in which the trench 11 extends in a plan view.

The insulating buried object 12 is buried in the trench 11. An insulating material constituting the insulating buried object 12 is arbitrary. The insulating buried object 12 may contain at least one of silicon oxide ($SiO_2$) and silicon nitride (SiN). The insulating buried object 12 is formed of silicon oxide in the present embodiment.

The insulating buried object 12 includes a buried portion 17 and a protruding portion 18. The buried portion 17 is located on a side of the bottom wall 15 of the trench 11 with respect to an open end 16 of the trench 11. The protruding portion 18 protrudes from the buried portion 17 toward a side opposite to the side of the bottom wall 15.

The semiconductor device 1 includes a p-type (first conductive type) well region 21 formed on a surface portion of the first main surface 3 in the device region 6. The well region 21 extends in the first direction X along the first main surface 3. A p-type impurity concentration in the well region 21 exceeds a p-type impurity concentration in the back gate region 20. The p-type impurity concentration in the well region 21 is, for example, $10 \times 10^{12}$ $cm^{-3}$ or more and $10 \times 10^{16}$ $cm^{-3}$ or less.

A bottom portion of the well region 21 is electrically connected to the back gate region 20. In the present embodiment, the well region 21 is formed deeper than the trench 11 and partially covers the bottom wall 15 of the trench 11. Unlike the present embodiment, the well region 21 may be formed in a region on a side of the first main surface 3 with respect to the bottom wall 15 of the trench 11, and a boundary between the well region 21 and the back gate region 20 may be located between the bottom wall 15 of the trench 11 and the first main surface 3.

The semiconductor device 1 includes an n-type (second conductive type) source region 22 formed on the surface portion of the well region 21 and an n-type (second conductive type) drain region 23 formed on the surface portion of the well region 21 at an interval from the source region 22. An n-type impurity concentration in the source region 22 and the drain region 23 is, for example, $10 \times 10^{16}$ $cm^{-3}$ or more and $10 \times 10^{20}$ $cm^{-3}$ or less.

A MOSFET channel region 24 is formed between the drain region 23 and the source region 22 on a surface portion of the device region 6. The channel region 24 forms a current path along the second direction Y between the source region 22 and the drain region 23.

The source region 22 has a bottom portion located on a side of the first main surface 3 with respect to a bottom portion of the well region 21. The drain region 23 has a bottom portion located on the side of the first main surface 3 with respect to the bottom portion of the well region 21.

The bottom portion of the source region 22 is flat with no steps. The source region 22 is in contact with the channel region 24, and an LDD (Lightly Doped Drain) region having a lower n-type impurity concentration than that of the source region 22 is not provided between the source region 22 and the channel region 24. The bottom portion of the drain region 23 is flat with no steps. The drain region 23 is in contact with the channel region 24, and an LDD (Lightly Doped Drain) region having a lower n-type impurity concentration than that of the drain region 23 is not provided between the drain region 23 and the channel region 24.

The semiconductor device 1 includes a planar gate structure 30 formed on the first main surface 3 in the device region 6 so as to face the channel region 24. The planar gate structure 30 extends in the first direction X along the first main surface 3. End portions of the planar gate structure 30 in the first direction X reach the trench isolation structure 10. Unlike the present embodiment, the end portions of the planar gate structure 30 in the first direction X may extend to the outside of the trench isolation structure 10. The planar gate structure 30 is located between the source region 22 and the drain region 23 in a plan view.

The planar gate structure 30 includes a gate insulating film 31 formed on the semiconductor layer 2 in the device region 6 and a gate electrode 32 formed on the gate insulating film 31.

The gate insulating film 31 is formed of oxide of the semiconductor layer 2. Specifically, the gate insulating film 31 is formed of oxide, which has been formed into a film by oxidizing the surface portion of the first main surface 3. That is, the gate insulating film 31 is formed of a silicon oxide film ($SiO_2$ film) formed along the first main surface 3. More specifically, the gate insulating film 31 is formed of thermal oxide of the semiconductor layer 2, which has been formed into a film shape by thermally oxidizing the surface portion of the first main surface 3 of the semiconductor layer 2. That is, the gate insulating film 31 is formed of a thermal silicon oxide film (thermal oxide film) formed along the first main surface 3. The gate insulating film 31 may have a thickness T1 of 7 nm or more and 13 nm or less (see FIG. 4). The thickness T1 of the gate insulating film 31 may be, for example, 10 nm.

The gate insulating film 31 extends in the first direction X along the first main surface 3. The gate insulating film 31 has a first surface 31a in contact with the first main surface 3 and a second surface 31b on a side opposite to the semiconductor layer 2 with respect to the first surface 31a. The first surface 31a and the second surface 31b may extend in parallel with each other, and the gate insulating film 31 may have a substantially constant thickness. Both end portions of the gate insulating film 31 in the first direction X are connected to the insulating buried object 12.

In the first main surface 3, a recess 33 for causing the first main surface 3 to be recessed toward the second main surface 4 is formed on both sides of the gate insulating film 31. The recess 33 may be formed in the entire region between the gate insulating film 31 and the protruding portion 18 of the insulating buried object 12 in the device region 6.

The gate electrode 32 is formed of conductive polysilicon. The gate electrode 32 is formed on the gate insulating film 31. A width (gate length) of the gate electrode 32 in the second direction Y may be 0.13 μm or more and 0.3 μm or less.

Referring to FIG. 3, the gate electrode 32 crosses the open end 16 of the trench 11 and reaches the insulating buried object 12. Specifically, the gate electrode 32 includes a main body portion 35 facing the first main surface 3 with the gate insulating film 31 interposed therebetween in the device region 6, and a drawing portion 36 facing the insulating buried object 12 on the outer side of the device region 6.

The main body portion 35 is formed on the gate insulating film 31 in the form of a film extending along the gate insulating film 31. The drawing portion 36 is drawn out from the main body portion 35 onto the protruding portion 18 of the insulating buried object 12.

Referring to FIG. 1, the semiconductor device 1 includes a memory structure 40 capable of writing, erasing, and reading data. The memory structure 40 is disposed adjacent to a lateral side of the planar gate structure 30 so as to cover a side wall of the gate electrode 32. Therefore, the memory structure 40 is also called a sidewall structure.

Specifically, the memory structure 40 covers a side wall of the main body portion 35 of the gate electrode 32 in the device region 6, and covers a side wall of the drawing portion 36 outside the device region 6.

The memory structure 40 has a square ring shape surrounding the planar gate structure 30 in a plan view. The memory structure 40 includes a first portion 40A and a second portion 40B facing the device region 6, and a pair of connecting portions 40C connecting the first portion 40A and the second portion 40B. The first portion 40A is a portion located between the source region 22 and the planar gate structure 30. The second portion 40B is a portion located between the drain region 23 and the planar gate structure 30. Each connecting portion 40C is a portion of the memory structure 40 located on the insulating buried object 12.

Referring to FIG. 2, the memory structure 40 has an inner surface 40a extending along the side wall of the planar gate structure 30 and an outer surface 40b curved so as to protrude toward a side opposite to a side of the planar gate structure 30. The memory structure 40 includes an insulating film 41 formed on the channel region 24, a charge storage film 42 facing the channel region 24 with the insulating film 41 interposed therebetween, and the insulating spacer 43 formed on the charge storage film 42.

The insulating film 41 is formed of oxide of the semiconductor layer 2 and the gate electrode 32. Specifically, the insulating film 41 is formed of oxide, which has been formed into a film by oxidizing the surface portion of the semiconductor layer 2 and the side wall of the gate electrode 32. The insulating film 41 is formed of a silicon oxide film ($SiO_2$ film) formed along the first main surface 3 and the side surface of the gate electrode 32. More specifically, the insulating film 41 is formed of thermal oxide, which has been formed into a film by thermally oxidizing the surface portion of the semiconductor layer 2 and the side wall of the gate electrode 32. That is, the insulating film 41 is formed of thermal silicon oxide film formed along the first main surface 3 and the side surface of the gate electrode 32.

Since the insulating film 41 is formed of oxide of the semiconductor layer 2 and the gate electrode 32, the insulating film 41 is not formed on the insulating buried object 12 (see FIG. 3).

Referring to FIG. 4, the insulating film 41 may have a thickness T2 of 5 nm or more and 10 nm or less. The thickness T2 of the insulating film 41 may be, for example, 8 nm. The insulating film 41 is desirably thinner than the gate insulating film 31 (T2<T1).

The insulating film 41 includes a first surface 41a in contact with the first main surface 3 of the semiconductor layer 2, a second surface 41b on a side opposite to the semiconductor layer 2 with respect to the first surface 41a, a third surface 41c in contact with the side wall of the planar gate structure 30 (the side wall of the gate electrode 32), and a fourth surface 41d opposite to the planar gate structure 30 with respect to the third surface 41c.

The insulating film 41 includes a first insulating portion 46 extending along the first main surface 3 of the semiconductor layer 2 in the device region 6, and a second insulating portion 47 connected to the first insulating portion 46 and extending along the side wall of the planar gate structure 30.

The insulating film 41 may be formed in an L-shape in cross section by connecting the first insulating portion 46 and the second insulating portion 47 at a right angle.

Since the insulating film 41 is not formed on the insulating buried object 12, the first insulating portion 46 is not provided in the connecting portion 40C of the memory structure 40 (see FIG. 3).

The insulating film 41 is formed on the first main surface 3 in the recess 33, and is adjacent to the gate insulating film 31. The first insulating portion 46 is located closer to a side of the second main surface 4 than the gate insulating film 31. The first surface 41a of the insulating film 41 may be located closer to the second main surface 4 (see FIG. 2) than the first surface 31a of the gate insulating film 31. The second surface 41b of the insulating film 41 may be formed flush with the first surface 31a of the gate insulating film 31.

The charge storage film 42 is formed of an insulator different from the insulating film 41, and is formed of, for example, a silicon nitride film (SiN film). The charge storage film 42 is formed along the insulating film 41. The charge storage film 42 may have a thickness T3 of 10 nm or more and 50 nm or less. The thickness T3 of the charge storage film 42 may be, for example, 30 nm.

The charge storage film 42 has a square ring shape surrounding the planar gate structure 30 in a plan view (see FIG. 1). That is, the charge storage film 42 extends in the first direction X, and both end portions of the charge storage film 42 in the first direction X are located outside the device region 6 (see FIG. 3). In the present embodiment, both end portions of the charge storage film 42 in the first direction X are located on the insulating buried object 12.

The charge storage film 42 includes a first storage portion 48 formed on the first insulating portion 46 of the insulating film 41, and a second storage portion 49 connected to the first storage portion 48 and formed on a lateral side of the second insulating portion 47. The charge storage film 42 may be formed in an L-shape in cross section by connecting the first storage portion 48 and the second storage portion 49 at a right angle.

The first storage portion 48 faces the insulating buried object 12 outside the device region 6. The first storage portion 48 faces the semiconductor layer 2 in the device region 6 with the first insulating portion 46 of the insulating film 41 interposed therebetween. The second storage portion 49 faces the planar gate structure 30 with the second insulating portion 47 of the insulating film 41 interposed therebetween.

The source region 22 and the drain region 23 are formed in a self-aligned manner with respect to the memory structure 40. Therefore, a boundary between the source region 22 and the channel region 24 substantially coincides with a boundary between the outer surface 40b of the memory structure 40 and the first main surface 3 in a plan view. Similarly, a boundary between the drain region 23 and the channel region 24 also substantially coincides with the boundary between the outer surface 40b of the memory structure 40 and the first main surface 3 in a plan view.

Specifically, the boundary between the source region 22 and the channel region 24 is located slightly closer to the planar gate structure 30 than the boundary between the outer surface 40b of the memory structure 40 and the first main surface 3. Similarly, the boundary between the drain region 23 and the channel region 24 is also located slightly closer to the planar gate structure 30 than the boundary between the outer surface 40b of the memory structure 40 and the first main surface 3.

Therefore, the first storage portion 48 of the charge storage film 42 includes a first facing portion 48A facing the channel region 24 with the insulating film 41 interposed therebetween, and a second facing portion 48B facing the source region 22 and the drain region 23. The first facing portion 48A is larger than the second facing portion 48B in a plan view (see FIG. 1).

The charge storage film 42 has a recess 50 formed by the first storage portion 48 and the second storage portion 49. The recess 50 is provided on a side opposite to the first insulating portion 46 with respect to the first storage portion 48 and on a side opposite to the second insulating portion 47 with respect to the second storage portion 49.

The insulating spacer 43 is disposed adjacent to the charge storage film 42 in the recess 50. The insulating spacer 43 is formed of, for example, silicon oxide. The insulating spacer 43 faces the insulating film 41 with the charge storage film 42 interposed therebetween.

The semiconductor device 1 further includes the covering insulating film 51 that covers the planar gate structure 30 and the memory structure 40. Both end portions of the covering insulating film 51 in the second direction Y are located on a side opposite to the planar gate structure 30 from a lateral side of the memory structure 40. The covering insulating film 51 extends in the first direction X, and both end portions of the covering insulating film 51 in the first direction X reach the insulating buried object 12 (see FIG. 3). Therefore, the covering insulating film 51 covers the source region 22 and the drain region 23 in the device region 6, and covers the insulating buried object 12 outside the device region 6.

Specifically, the covering insulating film 51 includes a first covering portion 52 that covers the gate electrode 32, a second covering portion 53 that covers the outer surface 40b of the memory structure 40, a third covering portion 54 that covers the source region 22 and the drain region 23 in the device region 6, and a fourth covering portion 55 that covers the protruding portion 18 of the insulating buried object 12 outside the device region 6 (see FIG. 3).

The third covering portion 54 covers the source region 22 on a lateral side of the first portion 40A of the memory structure 40 and covers the drain region 23 on a lateral side of the second portion 40B. The fourth covering portion 55 covers the insulating buried object 12 on a lateral side of the connecting portion 40C of the memory structure 40 (see FIG. 3). A through-hole 52A is formed in a region of the first covering portion 52 facing the trench isolation structure 10 with the gate electrode 32 interposed therebetween (see FIG. 3).

Referring to FIGS. 2 and 3, the semiconductor device 1 includes a gate silicide film 60, a source silicide film 61, and a drain silicide film 62.

Referring to FIG. 3, the gate silicide film 60 is formed on a surface of the gate electrode 32 at a portion constituting a bottom portion of the through-hole 52A. The gate silicide film 60 is formed of a polycide film formed integral with the gate electrode 32.

Referring to FIG. 2, the source silicide film 61 and the drain silicide film 62 are composed of silicide films formed integral with the semiconductor layer 2. The source silicide film 61 is formed on a surface portion of the source region 22 on a side opposite to the memory structure 40 with respect to the covering insulating film 51. The drain silicide film 62 is formed on a surface portion of the drain region 23 on a side opposite to the memory structure 40 with respect to the covering insulating film 51.

The gate silicide film 60, the source silicide film 61, and the drain silicide film 62 may contain at least one of TiSi, TiSi$_2$, NiSi, CoSi, CoSi$_2$, MoSi$_2$, and WSi$_2$, respectively.

The semiconductor device 1 includes the interlayer insulating film 65 that covers the first main surface 3. The interlayer insulating film 65 includes at least one of an oxide film (SiO$_2$ film) and a nitride film (SiN film). The interlayer insulating film 65 may have a single-layer structure composed of an oxide film or a nitride film. The interlayer insulating film 65 may have a laminated structure in which one or more oxide films and one or more nitride films are laminated in an arbitrary order. The interlayer insulating film 65 covers the trench isolation structure 10 and the device region 6 on the first main surface 3.

The semiconductor device 1 includes a gate contact electrode 66, a source contact electrode 67, and a drain contact electrode 68, which penetrate the interlayer insulating film 65.

The gate contact electrode 66 is electrically connected to the gate electrode 32 via the gate silicide film 60. Specifically, the gate contact electrode 66 is electrically connected to the gate electrode 32 and faces the insulating buried object 12 with the gate electrode 32 interposed therebetween.

Unlike the present embodiment, when the gate electrode 32 extends to the outside of the insulating buried object 12, the gate contact electrode 66 may face the semiconductor layer 2 at a location outward of the insulating buried object 12.

The source contact electrode 67 is electrically connected to the source region 22 via the source silicide film 61. The drain contact electrode 68 is electrically connected to the drain region 23 via the drain silicide film 62.

The gate contact electrode 66, the source contact electrode 67, and the drain contact electrode 68 are embedded in contact holes 69 formed in the interlayer insulating film 65. Each contact electrode (the gate contact electrode 66, the source contact electrode 67, or the drain contact electrode 68) is formed of at least one of copper and tungsten.

A barrier electrode film may be provided between each contact electrode and an inner wall of the corresponding contact hole 69. The barrier electrode film may have a single-layer structure composed of a Ti film or a TiN film. The barrier electrode film may have a laminated structure including a Ti film and a TiN film laminated in an arbitrary order.

The semiconductor device 1 includes a gate wiring 70, a source wiring 71, and a drain wiring 72, which are formed on the interlayer insulating film 65. The gate wiring 70 is electrically connected to the gate contact electrode 66. The drain wiring 72 is electrically connected to the drain contact electrode 68. The source wiring 71 is electrically connected to the source contact electrode 67.

Each wiring (the gate wiring 70, the source wiring 71, or the drain wiring 72) may include at least one of an Al film, an AlSiCu alloy film, an AlSi alloy film, and an AlCu alloy film.

A barrier wiring film may be provided between each wiring and the interlayer insulating film 65. The barrier wiring film may have a single-layer structure composed of a Ti film or a TiN film. The barrier wiring film may have a laminated structure including a Ti film and a TiN film laminated in an arbitrary order. The barrier wiring film may also be provided on each wiring.

Next, respective operations (a write operation, an erase operation, and a read operation) of the memory structure 40 will be specifically described with reference to FIGS. 5A to 6. In any of the operations, a reference potential is applied to the back gate region 20 connected to the well region 21.

Figure 5A:
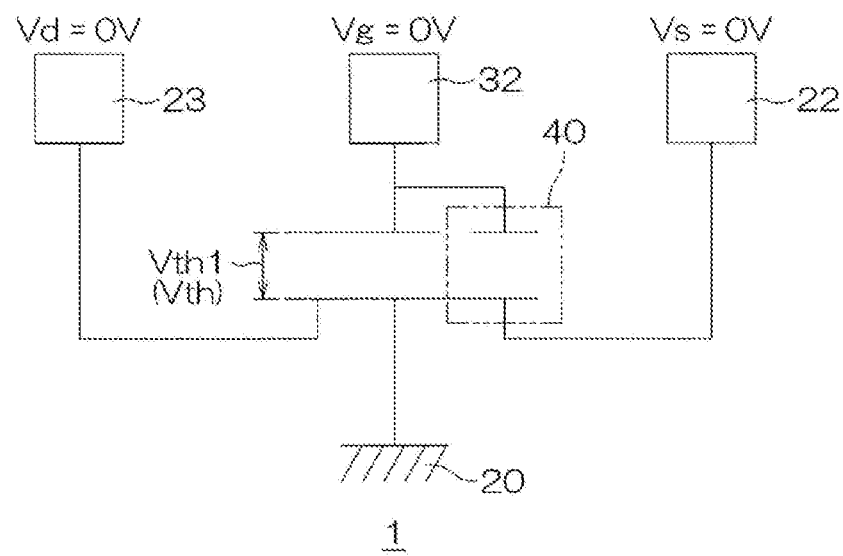
FIG. 5A is a schematic diagram for explaining a state of an electric circuit before a write operation of a memory structure provided in the semiconductor device.
Figure 5B:
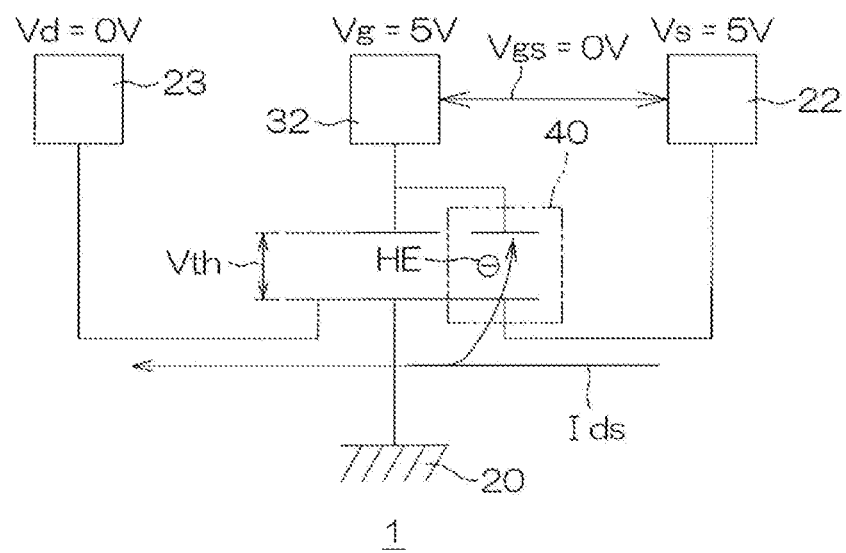
FIG. 5B is a schematic diagram for explaining the write operation of the memory structure.
Figure 6:
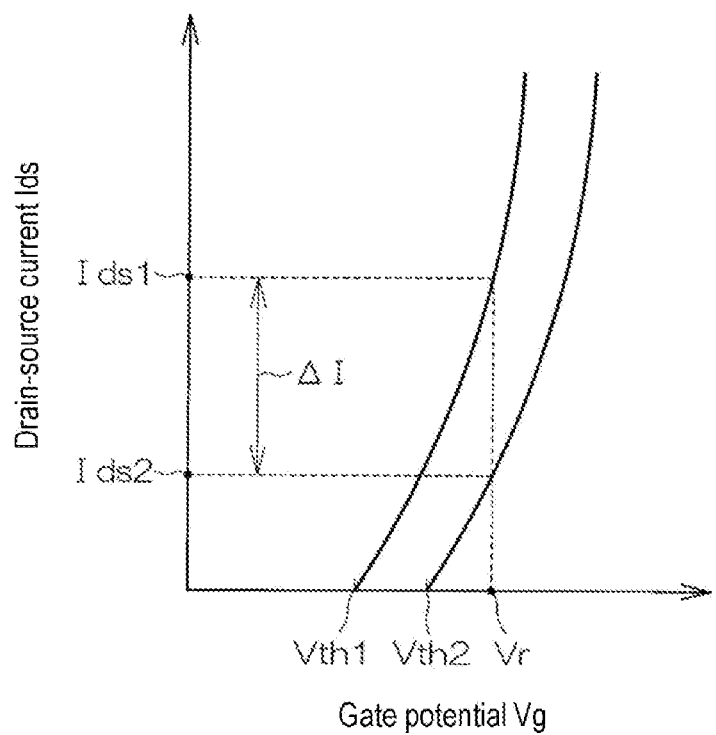
FIG. 6 is a graph showing a relationship between a gate potential and a drain-source current after the write operation and the erase operation.

FIG. 5A is a schematic diagram for explaining an initial state of the memory structure 40 before the write operation. FIG. 5B is a schematic diagram for explaining the write operation of the memory structure 40.

As shown in FIG. 5A, a gate threshold voltage Vth before potentials are applied to the gate electrode 32, the source region 22, and the drain region 23 is set as a first threshold voltage Vth1 (initial threshold voltage). The state before a potential is applied to the gate electrode 32, the source region 22, and the drain region 23 means a state in which a gate potential Vg, a source potential Vs, and a drain potential Vd are all 0 V (Vg=Vs=Vd=0 V). The gate potential Vg is a potential applied to the gate electrode 32. The source potential Vs is a potential applied to the source region 22. The drain potential Vd is a potential applied to the drain region 23.

As shown in FIG. 5B, the write operation is achieved by injecting electrons (hot electrons HE) generated by impact ionization in a vicinity of the source region 22 into the charge storage film 42.

Specifically, during the write operation, a positive potential (e.g., 5 V) is applied to the gate electrode 32 and the source region 22 (Vg=Vs=5V), and the reference potential is applied to the drain region 23 (Vd=0 V). As a result, a drain-source current Ids flows from the source region 22 toward the drain region 23, and an electric field is concentrated in a vicinity of the source region 22. Therefore, the hot electrons HE are generated by impact ionization in the vicinity of the source region 22. The hot electrons HE are injected into the charge storage film 42 (see FIG. 4) of the memory structure 40.

The gate potential Vg and the source potential Vs in the write operation are not limited to 5 V, and may be an arbitrary potential selected from a range of, for example, 5 V or more and 7 V or less.

A potential difference between the source region 22 and the gate electrode 32 is called a gate-source voltage Vgs. For example, when the gate potential Vg is 5 V and the source potential Vs is 5 V, the gate-source voltage Vgs is 0 V (Vgs=0 V).

The gate threshold voltage Vth rises due to a negative charge of the electrons injected into the charge storage film 42 by the write operation. Specifically, the gate threshold voltage Vth is set as a second threshold voltage Vth2 (see FIG. 5D) higher than the first threshold voltage Vth1 (Vth=Vth2, Vth2>Vth1).

Figure 5C:
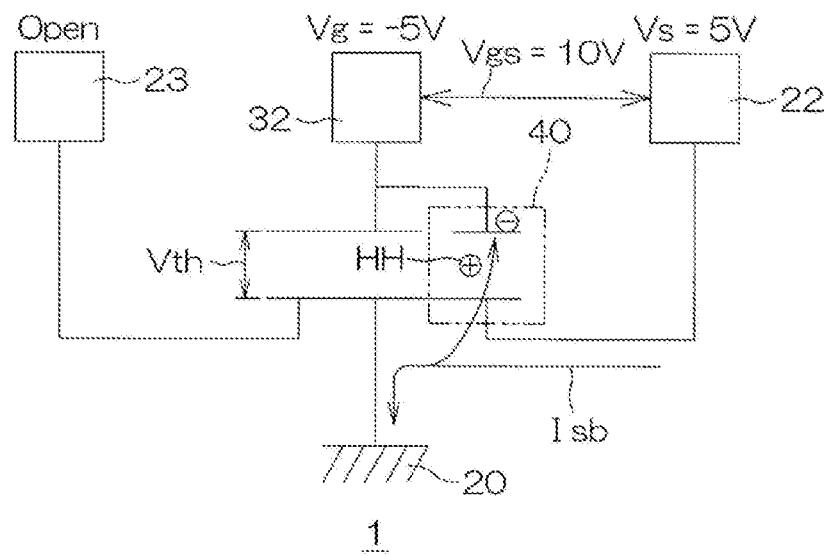
FIG. 5C is a schematic diagram for explaining an erase operation of the memory structure.

FIG. 5C is a schematic diagram for explaining the erase operation of the memory structure 40. As shown in FIG. 5C, the erase operation is achieved by injecting holes (hot holes HH) generated by an inter-band tunneling phenomenon into the charge storage film 42.

Specifically, during the erase operation, a negative potential (e.g., −5 V) is applied to the gate electrode 32 (Vg=−5 V), a positive potential (e.g., 5 V) is applied to the source region 22 (Vs=5 V), and the drain region 23 is opened. That is, a high voltage is applied between the source region 22 and the gate electrode 32. As a result, a source-back gate current Isb flows from the source region 22 to the back gate region 20 via the well region 21.

Therefore, the hot holes HH are generated by the inter-band tunneling phenomenon in a vicinity of a boundary between the well region 21 and the source region 22. The hot holes HH are injected into the charge storage film 42 (see FIG. 4) of the memory structure 40.

The gate potential Vg in the erase operation is not limited to −5 V, and may be an arbitrarily selected potential from a range of, for example, −7 V or more and −3 V or less. The source potential Vs in the erase operation is not limited to 5 V, and may be a potential arbitrarily selected from a range of 5 V or more and 7 V or less.

In the erase operation, when the gate potential Vg is −5 V and the source potential Vs is 5 V, the gate-source voltage Vgs is 10 V (Vgs=10 V). For example, when the thickness T2 of the insulating film 41 is 8 nm and the thickness T1 of the gate insulating film is 10 nm, the insulating film 41 is thinner than the gate insulating film 31. Therefore, the gate-source voltage Vgs is efficiently divided into the charge storage film 42 as compared with a configuration in which the thickness of the insulating film 41 and the thickness of the gate insulating film 31 are equal to each other. Therefore, the electric field can be easily concentrated in the vicinity of the source region 22, and the hot holes HH can be easily generated.

The gate threshold voltage Vth drops due to a positive charge of the holes injected into the charge storage film 42 by the erase operation. Specifically, the gate threshold voltage Vth returns from the second threshold voltage Vth2 to the first threshold voltage Vth1 (see FIG. 5E) (Vth=Vth1).

Figure 5D:
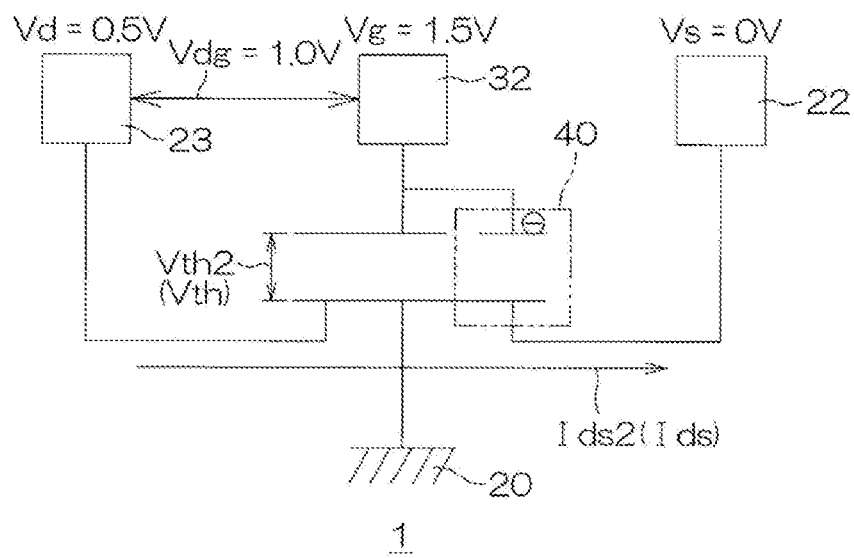
FIG. 5D is a schematic diagram for explaining a read operation of the memory structure after the write operation.
Figure 5E:
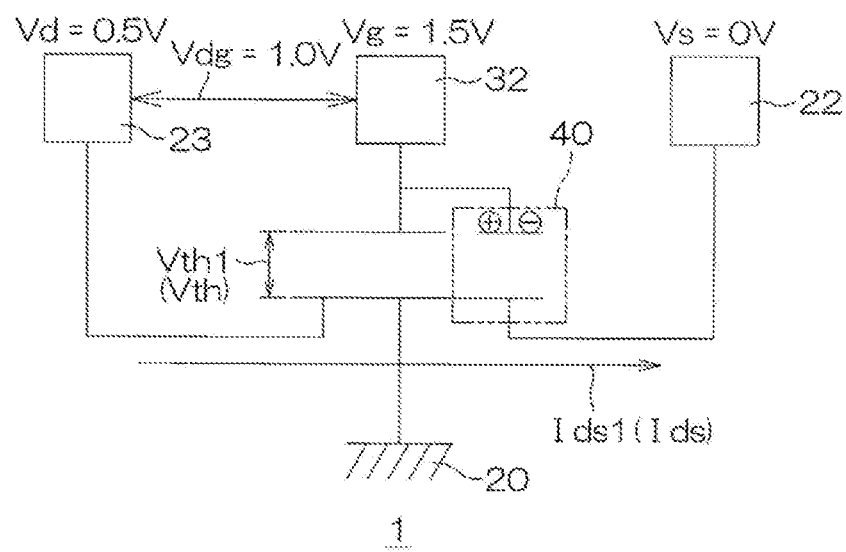
FIG. 5E is a schematic diagram for explaining a read operation of the memory structure after the erase operation.

Next, the read operation of the memory structure 40 will be described. FIG. 5D is a schematic diagram for explaining the read operation performed after the write operation. FIG. 5E is a schematic diagram for explaining the read operation performed after the erase operation (i.e., the initial state). FIG. 6 is a graph showing a relationship between the gate potential Vg and the drain-source current Ids after the write operation and the erase operation.

During the read operation, the drain-source current Ids flows in a reverse direction compared with the write operation. Whether or not data is written to the memory structure 40 is determined by a magnitude of the drain-source current Ids. Specifically, in the read operation, both after the write operation and after the erase operation, a positive potential (e.g., 1.5 V) is applied to the gate electrode 32, a positive potential (e.g., 0.5 V) is applied to the drain region 23, and the reference potential is applied to the source region 22 (Vs=0 V).

When the gate potential Vg is 1.5 V and the drain potential Vd is 0.5 V, a potential difference (drain-gate voltage Vdg) between the drain region 23 and the gate electrode 32 is 1.0 V(Vg=1.5 V, Vd=0.5 V, and Vdg=1.0 V).

The gate threshold voltage Vth (second threshold voltage Vth2) after the write operation is larger than the gate threshold voltage (first threshold voltage Vth1) after the erase operation. Therefore, as shown in FIG. 6, when the gate potential Vg at the time of reading is a predetermined read-out potential Vr(Vg=Vr), a drain-source current Ids2 in the read operation after the write operation is smaller than a drain-source current Ids2 in the read operation after the erase operation. Based on this current difference ΔI(ΔI=Ids1−Ids2), it is possible to determine whether or not data has been written to the memory structure 40.

The first threshold voltage Vth1 is, for example, 0.7 V or more and 2.0 V or less, and the second threshold voltage Vth2 is a voltage obtained by adding a potential to the first threshold voltage Vth1. For example, when the first threshold voltage Vth1 is 1.0 V, the second threshold voltage Vth2 becomes a voltage (1.2 V or more and 5.0 V or less), which is higher than the first threshold voltage Vth1. The read-out potential Vr is, for example, 1.5 V or more and 5.0 V or less.

In the present embodiment, the bottom of the source region 22 and the bottom of the drain region 23 are flat without steps, respectively, and the source region 22 and the drain region 23 are not provided with an LDD region. Therefore, the charge storage film 42 faces the channel region 24. Thus, hot carriers are easily generated. Accordingly, the hot electrons HE can be injected into the charge storage film 42 during the write operation, and the hot holes HH can be drawn into the charge storage film 42 during the erase operation. Therefore, it is possible to efficiently repeat the writing of data to the memory structure 40 and the erasing of data from the memory structure 40.

Further, by making the insulating film 41 thinner than the gate insulating film 31, the gate-source voltage Vgs can be efficiently divided into the charge storage film 42. Therefore, the hot holes HH can be easily drawn into the charge storage film 42.

Further, in the present embodiment, the memory structure 40 is covered with the covering insulating film 51. Therefore, it is possible to prevent the memory structure 40 from becoming silicide.

Further, in the present embodiment, the covering insulating film 51 partially covers the source region 22 and the drain region 23 on the lateral side of the memory structure 40. The source silicide film 61 and the drain silicide film 62 are formed on the surface portions of the source region 22 and the drain region 23, respectively, on the side opposite to the memory structure 40 with respect to the covering insulating film 51. Therefore, the source silicide film 61 and the drain silicide film 62 can be kept away from the charge storage film 42 as compared to a configuration in which the covering insulating film 51 does not cover the source region 22 and the drain region 23. As a result, it is possible to suppress outflow of electrons from the charge storage film 42.

Further, in the present embodiment, the charge storage film 42 has the recess 50 on the side opposite to the planar gate structure 30 with respect to the first storage portion 48 and on the side opposite to the semiconductor layer 2 with respect to the second storage portion 49, and the insulating spacer 43 is disposed in the recess 50. Therefore, the charge storage film 42 is surrounded by the insulating film 41 and the insulating spacer 43, i.e., insulators. Accordingly, it is possible to efficiently divide the gate-source voltage Vgs into the charge storage film 42.

FIGS. 7A to 7Y are cross-sectional views for explaining an example of a method of manufacturing the semiconductor device 1 shown in FIG. 1. FIGS. 7A to 7Y are cross-sectional views of a region corresponding to FIG. 2. FIGS. 7A to 7Y show only a method of manufacturing the device region 6 in which the MOSFET is formed.

Referring first to FIG. 7A, a semiconductor wafer 75 is prepared. The semiconductor wafer 75 serves as a base for the semiconductor layer 2. The semiconductor wafer 75 has a first wafer main surface 76 on one side and a second wafer main surface 77 on the other side. The first wafer main surface 76 and the second wafer main surface 77 correspond to the first main surface 3 and the second main surface 4 of the semiconductor layer 2, respectively (see FIG. 2).

Subsequently, a resist mask 80 having a predetermined pattern is formed on the semiconductor wafer 75. The resist mask 80 exposes a region of the semiconductor wafer 75 where the trench 11 is to be formed, and covers other regions.

Subsequently, as shown in FIG. 7B, an unnecessary portion of the first wafer main surface 76 is removed by an etching method via the resist mask 80. The etching method may be a dry etching method (e.g., an RIE method) and/or a wet etching method. The etching method is desirably a dry etching method (e.g., an RIE method).

As a result, the trench 11 for defining the device region 6 is formed on the first wafer main surface 76. The resist mask 80 is then removed. The detailed description of the trench 11 is as described above and, therefore, will be omitted.

Referring subsequently to FIG. 7C, a base insulating film 81, which serves as a base of the insulating buried object 12, is formed on the first wafer main surface 76. In the present embodiment, the base insulating film 81 is formed of silicon oxide. The base insulating film 81 may be formed by a CVD method. The base insulating film 81 fills the trench 11.

Referring subsequently to FIG. 7D, unnecessary portions of the base insulating film 81 are removed by an etching method. The base insulating film 81 is removed until the first wafer main surface 76 is exposed. The etching method may be a dry etching method (e.g., an RIE method) and/or a wet etching method. As a result, the insulating buried object 12 located in the trench 11 is formed.

Figure 7E:
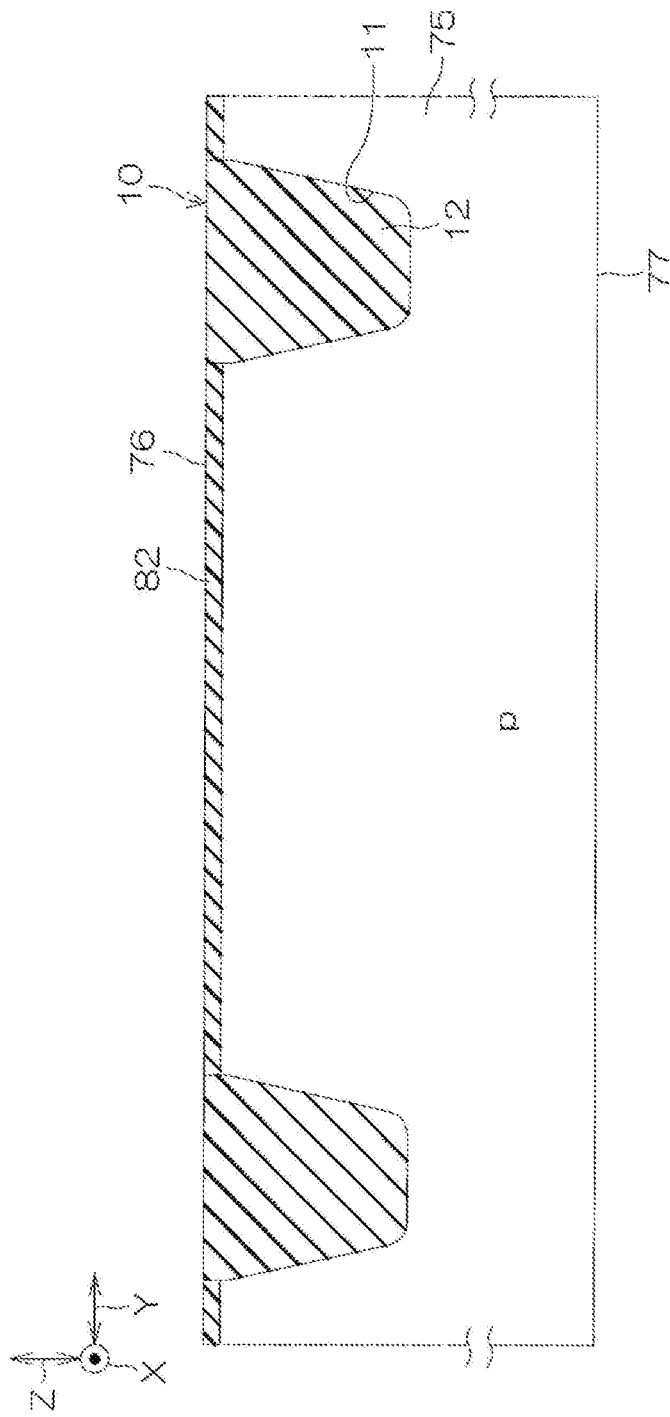
FIG. 7E is a cross-sectional view showing a process after FIG. 7D.

Referring subsequently to FIG. 7E, a first base film 82, which serves as a base of the gate insulating film 31 (see FIG. 2), is formed on a surface portion of the first wafer main surface 76 in the device region 6. The first base film 82 is formed of oxide of the semiconductor wafer 75. The first base film 82 is formed by oxidizing the surface portion of the first wafer main surface 76 into a film by an oxidation treatment method. Specifically, the first base film 82 is formed by a thermal oxidation treatment method.

According to the oxidation treatment method (thermal oxidation treatment method), a silicon oxide film (thermal silicon oxide film) extending along the first wafer main surface 76 is formed. A thickness of the first base film 82 may be equal to the thickness T1 of the gate insulating film 31 (see FIG. 4), i.e., 7 nm or more and 13 nm or less. The first base film 82 is formed integral with the insulating buried object 12.

Referring subsequently to FIG. 7F, the p-type well region 21 is formed on the surface portion of the first wafer main surface 76 in the device region 6. The well region 21 is formed by introducing p-type impurities into the surface portion of the first wafer main surface 76 by an ion implantation method via the gate insulating film 31. By forming the well region 21, the region of the semiconductor wafer 75 having a lower p-type impurity concentration than the well region 21 becomes the back gate region 20.

The p-type impurities may be introduced into the first wafer main surface 76 at an arbitrary timing. For example, the introduction of p-type impurities into the first wafer main surface 76 may be performed before the gate insulating film 31 is formed on the first wafer main surface 76. In that case, a sacrificial oxide film may be formed on the first wafer main surface 76, and the p-type impurities may be introduced into the first wafer main surface 76 via the sacrificial oxide film. Then, after the sacrificial oxide film is removed, the gate insulating film 31 is formed.

Figure 7G:
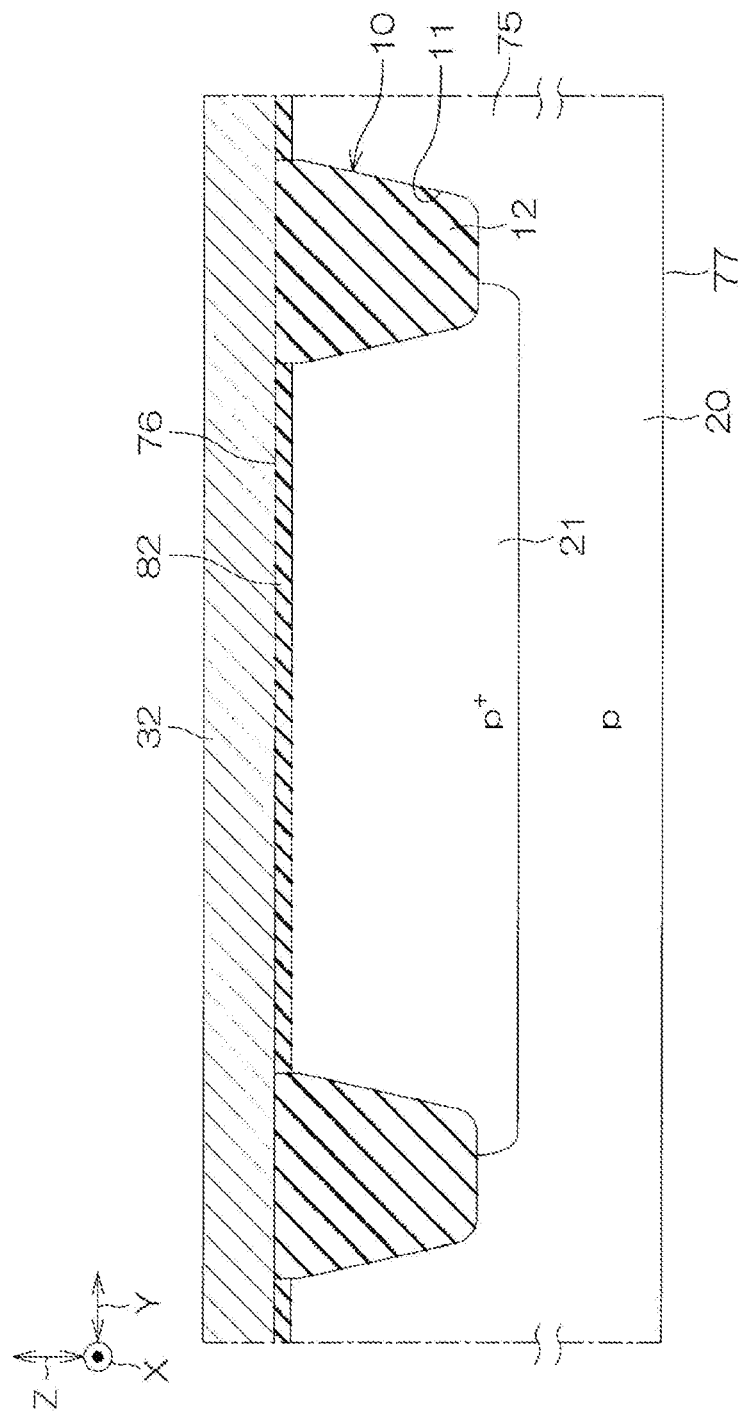
FIG. 7G is a cross-sectional view showing a process after FIG. 7F.

Referring subsequently to FIG. 7G, the gate electrode 32 is formed on the first wafer main surface 76 so as to cover the first base film 82 and the insulating buried object 12. The gate electrode 32 is formed of conductive polysilicon in the present embodiment. The gate electrode 32 may be formed by a CVD method.

Figure 7H:
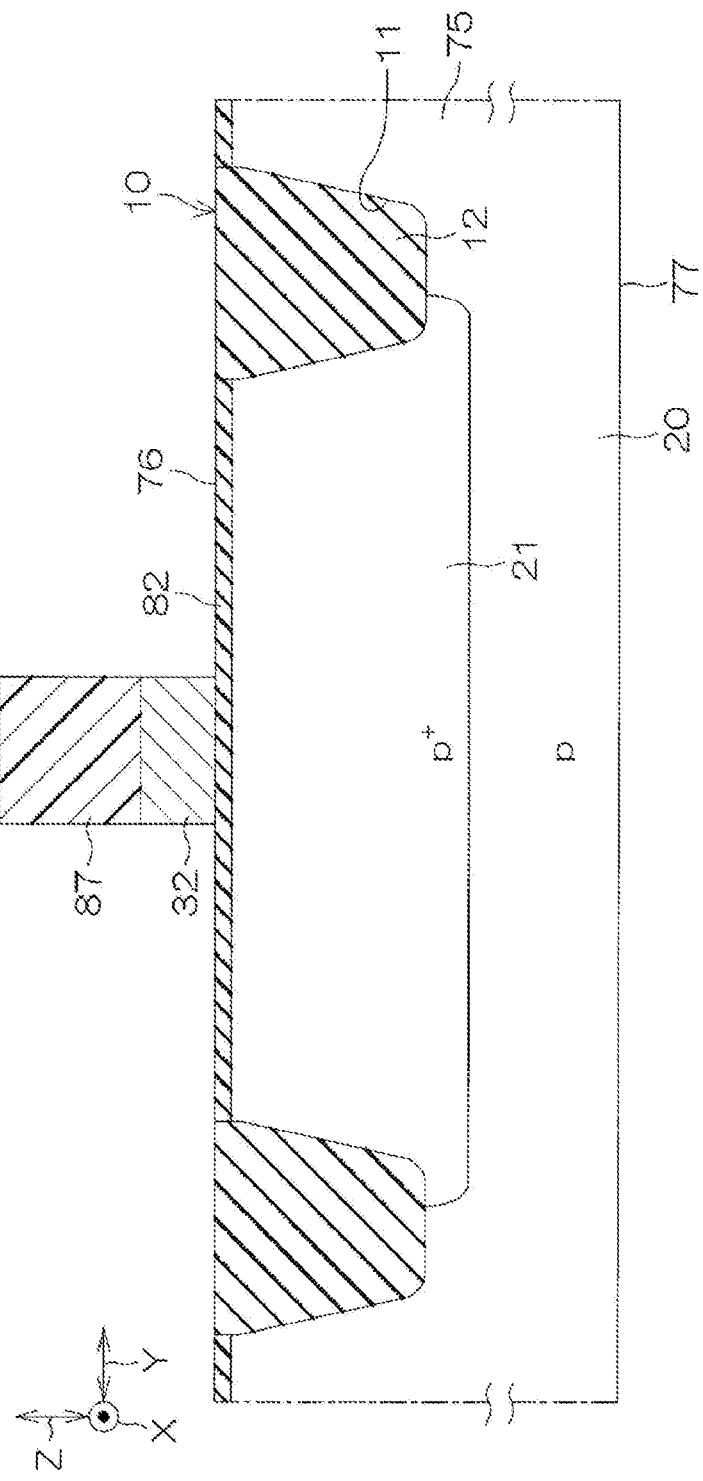
FIG. 7H is a cross-sectional view showing a process after FIG. 7G.
Figure 71:
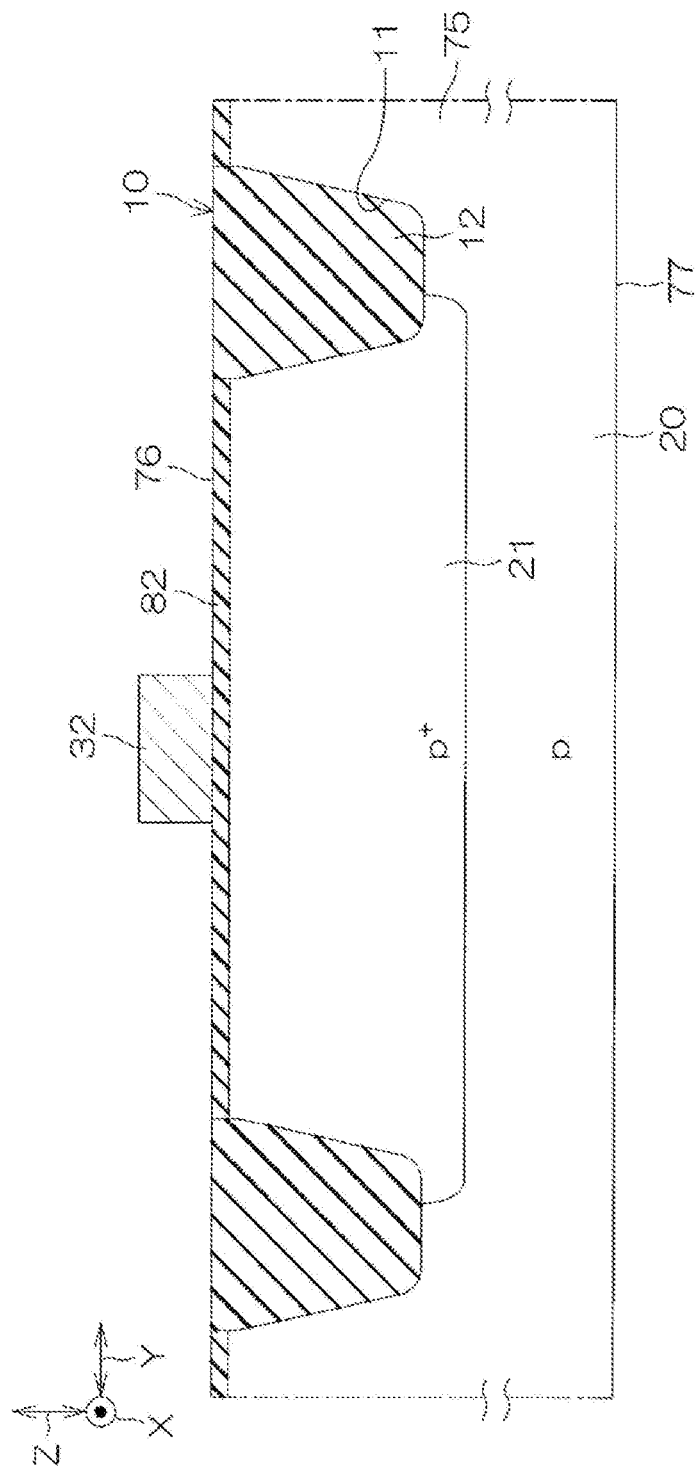

Referring subsequently to FIG. 7H, a resist mask 87 having a predetermined pattern is formed on the gate electrode 32. The resist mask 87 exposes unnecessary portions of the gate electrode 32 and covers other regions. Subsequently, the unnecessary portions of the gate electrode 32 are removed by an etching method via the resist mask 87. The etching method may be a dry etching method (e.g., an RIE method) and/or a wet etching method. Wet etching may be performed, for example, by supplying HF (hydrofluoric acid). As a result, the gate electrode 32 is formed. Then, as shown in FIG. 7I, the resist mask 87 is removed.

Figure 7J:
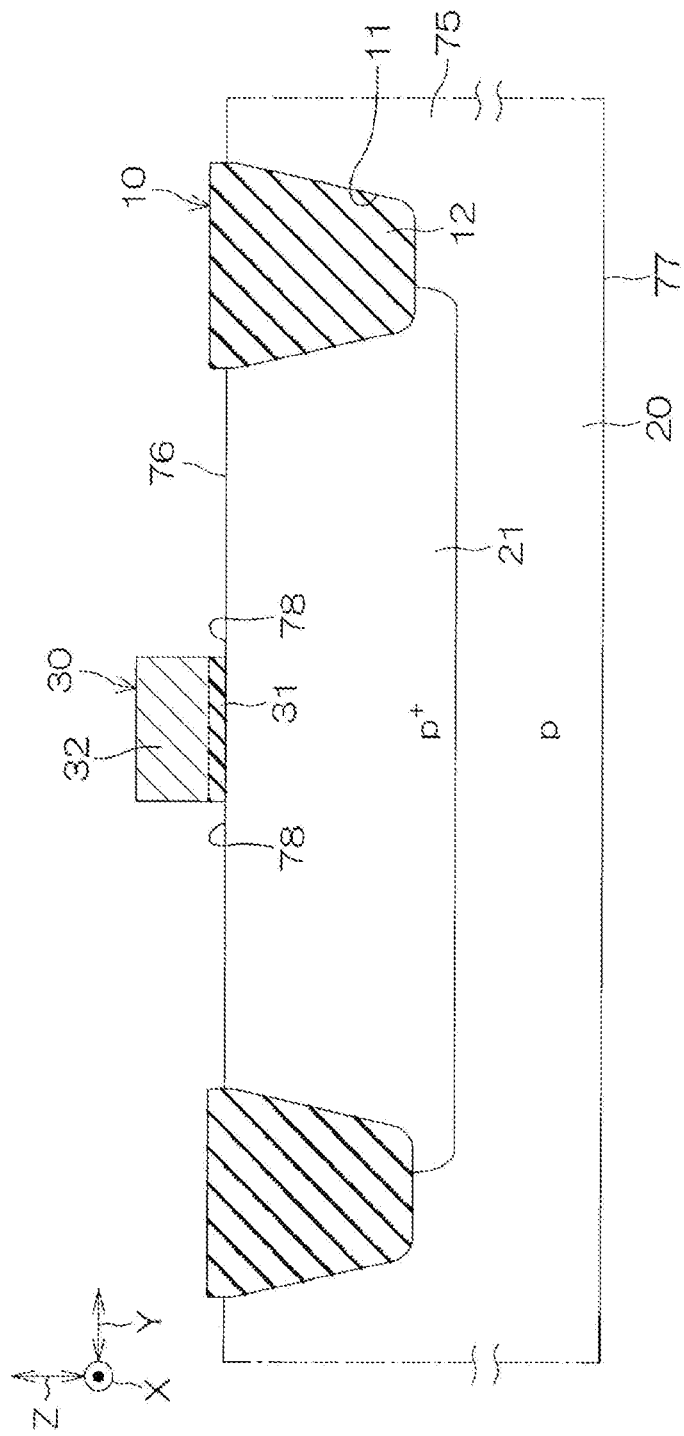
FIG. 7J is a cross-sectional view showing a process after FIG. 7I.

Referring subsequently to FIG. 7J, the first base film 82 is partially removed by an etching method to form the gate insulating film 31. By partially removing the first base film 82, the first wafer main surface 76 retracts toward the second wafer main surface 77 on the lateral side of the gate insulating film 31. Due to the retraction of the first wafer main surface 76, a first recess 78 for causing the first wafer main surface 76 to be recessed toward the second wafer main surface 77 is formed on the lateral side of the planar gate structure 30. As described above, by the partial removal of the first base film 82, the gate insulating film 31 and the first recess 78 are formed. Due to the retraction of the first wafer main surface 76, a part of the insulating buried object 12 protrudes from the trench 11.

The etching method may be a dry etching method (e.g., an RIE method) and/or a wet etching method. By the partial removal of the first base film 82, the planar gate structure 30 including the gate insulating film 31 and the gate electrode 32 is formed.

Referring subsequently to FIG. 7K, a second base film 83, which serves as a base of the insulating film 41 (see FIG. 2), is formed on the surface portion of the first wafer main surface 76 in the first recess 78 and on the surface portion of the gate electrode 32. The second base film 83 is formed of oxide of the semiconductor wafer 75 and the gate electrode 32. The second base film 83 is formed by oxidizing the surface portion of the semiconductor wafer 75 in the device region 6 and the surface portion of the gate electrode 32 into a film shape by an oxidation treatment method. Specifically, the second base film 83 is formed by a thermal oxidation treatment method.

According to the oxidation treatment method (thermal oxidation treatment method), a silicon oxide film (thermal silicon oxide film) is formed along the first wafer main surface 76 and the gate electrode 32. A thickness of the second base film 83 may be equal to the thickness T2 of the insulating film 41 (see FIG. 4), i.e., 5 nm or more and 10 nm or less.

Referring subsequently to FIG. 7L, a third base film 84, which serves as a base of the charge storage film 42, is formed on the first wafer main surface 76 so as to cover the second base film 83 and the insulating buried object 12. The third base film 84 is formed of silicon nitride in the present embodiment. The third base film 84 may be formed by a CVD method. A thickness of the third base film 84 may be equal to the thickness T3 of the charge storage film 42 (see FIG. 4), i.e., 10 nm or more and 50 nm or less.

Figure 7M:
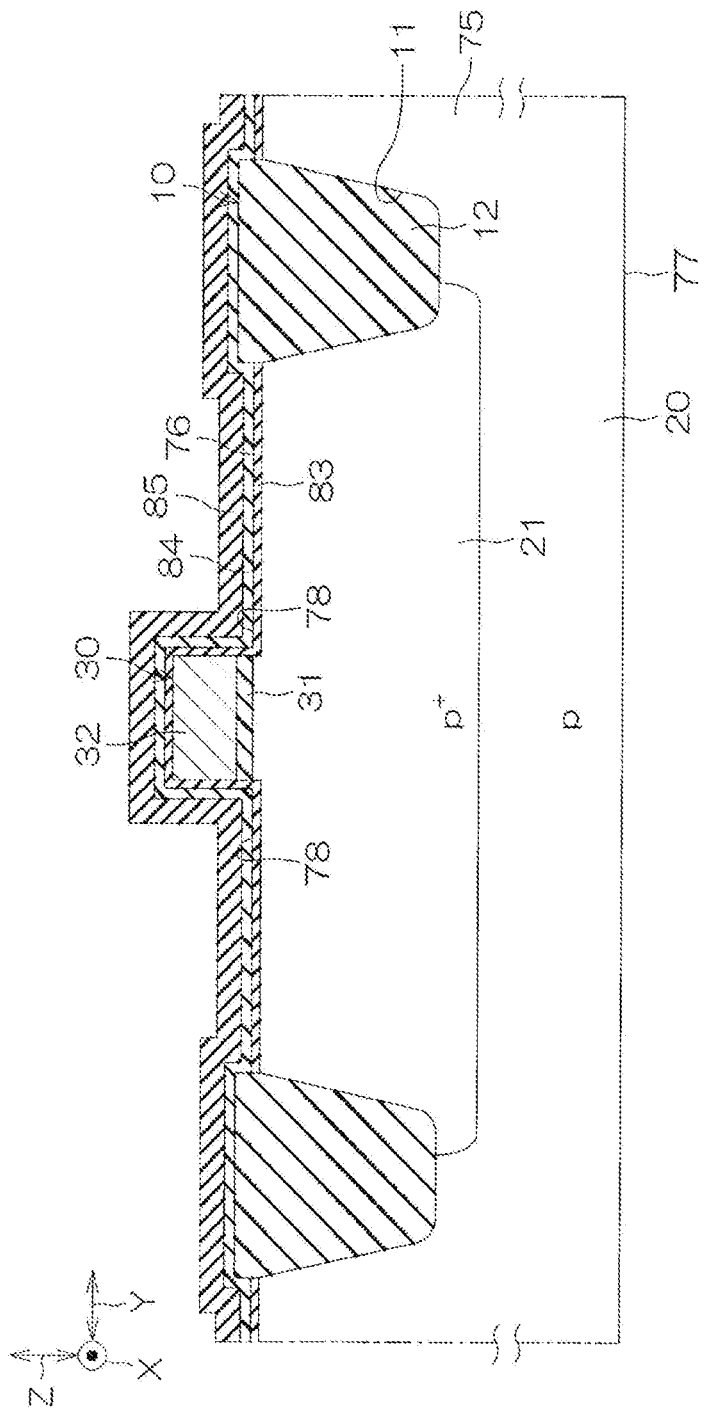
FIG. 7M is a cross-sectional view showing a process after FIG. 7L.

Referring subsequently to FIG. 7M, a fourth base film 85, which serves as a base of the insulating spacer 43 (see FIG. 2), is formed on the first wafer main surface 76 so as to cover the third base film 84. The fourth base film 85 is formed of silicon oxide in the present embodiment. The fourth base film 85 may be formed by a CVD method.

Figure 7N:
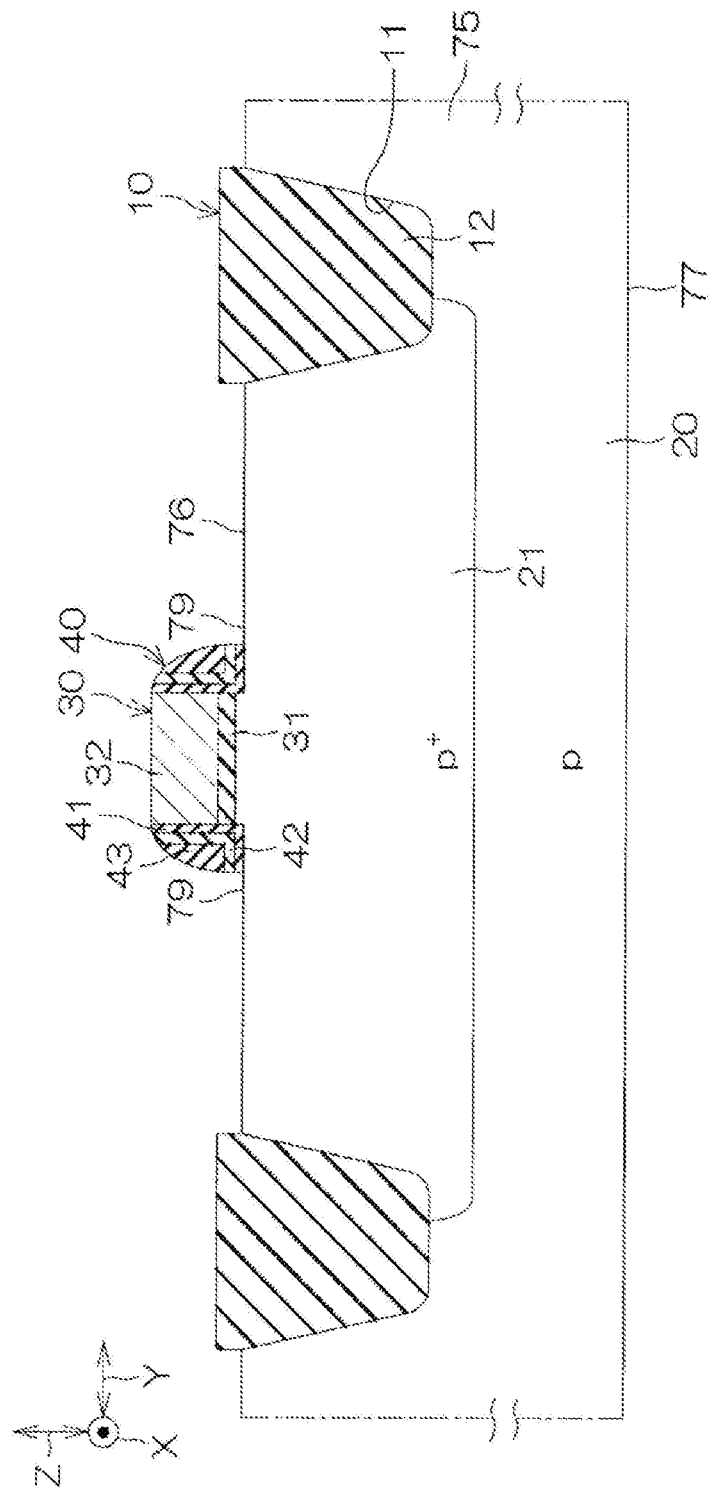
FIG. 7N is a cross-sectional view showing a process after FIG. 7M.
Figure 70:
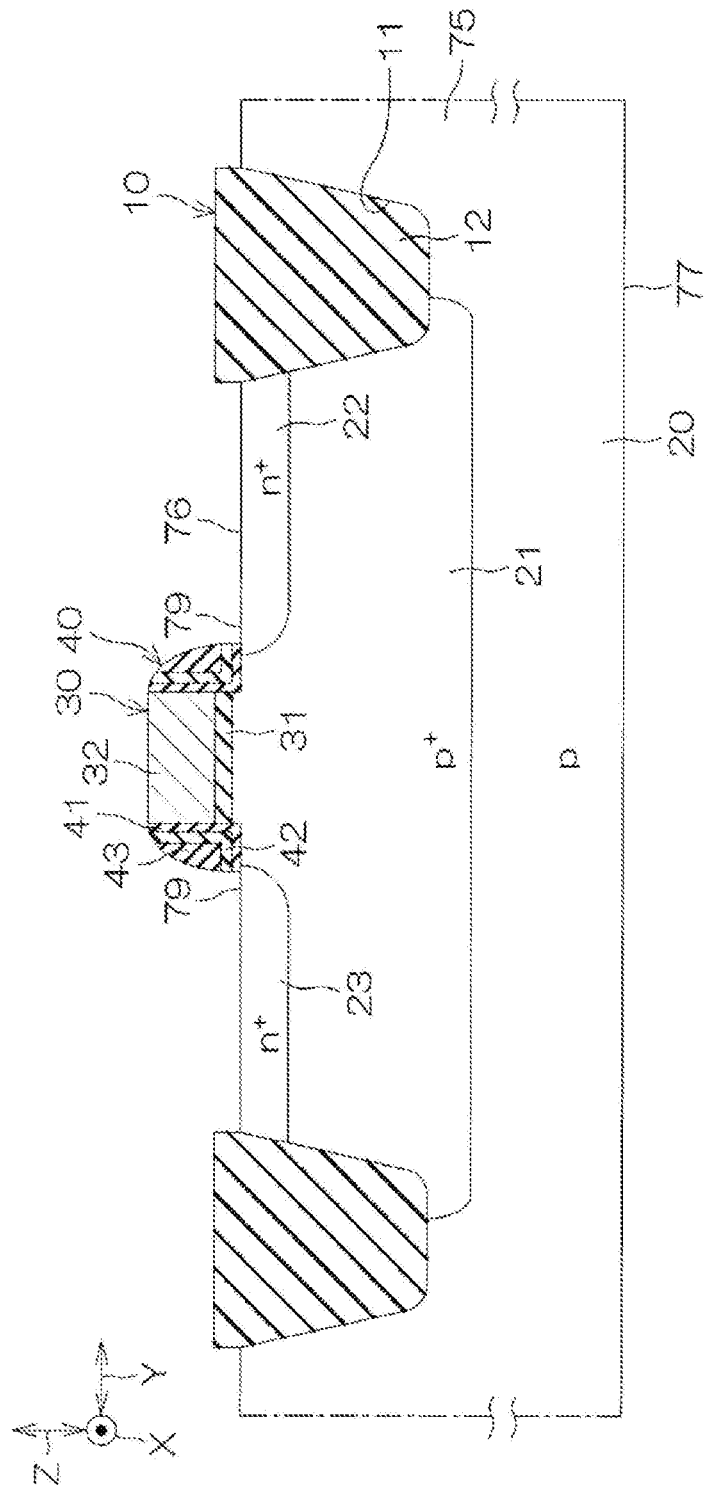

Referring subsequently to FIG. 7N, the second base film 83, the third base film 84, and the fourth base film 85 are partially removed by etching so as to leave a portion that covers the side wall of the planar gate structure 30. As a result, the memory structure 40 including the insulating film 41, the charge storage film 42, and the insulating spacer 43 is formed. That is, the memory structure 40 is formed in a self-aligned manner with respect to the planar gate structure 30. The etching method may be a dry etching method (e.g., an RIE method).

By partially removing the second base film 83, the first wafer main surface 76 is further retracted toward the second wafer main surface 77 on the lateral side of the memory structure 40. Due to the retraction of the first wafer main surface 76 toward the second wafer main surface 77, the first recess 78 on the lateral side of the planar gate structure 30 becomes deeper to form a second recess 79. The insulating film 41 is disposed on the first wafer main surface 76 in the second recess 79. The second recess 79 corresponds to the recess 33 (see FIG. 4). The retraction of the first wafer main surface 76 increases an amount of protrusion of the insulating buried object 12 from the trench 11.

Referring subsequently to FIG. 7O, the n-type drain region 23 and the n-type source region 22 are formed on the surface portion of the well region 21. Specifically, the source region 22 is formed on the surface portion of the well region 21 on one side of the memory structure 40 by introducing n-type impurities into the surface portion of the well region 21 by an ion implantation method using the memory structure 40 as a mask. The drain region 23 is formed on the surface portion of the well region 21 on the other side of the memory structure 40 by introducing n-type impurities into the surface portion of the well region 21 by an ion implantation method using the memory structure 40 as a mask. That is, each of the drain region 23 and the source region 22 is formed in a self-aligned manner with respect to the memory structure 40.

Figure 7P:
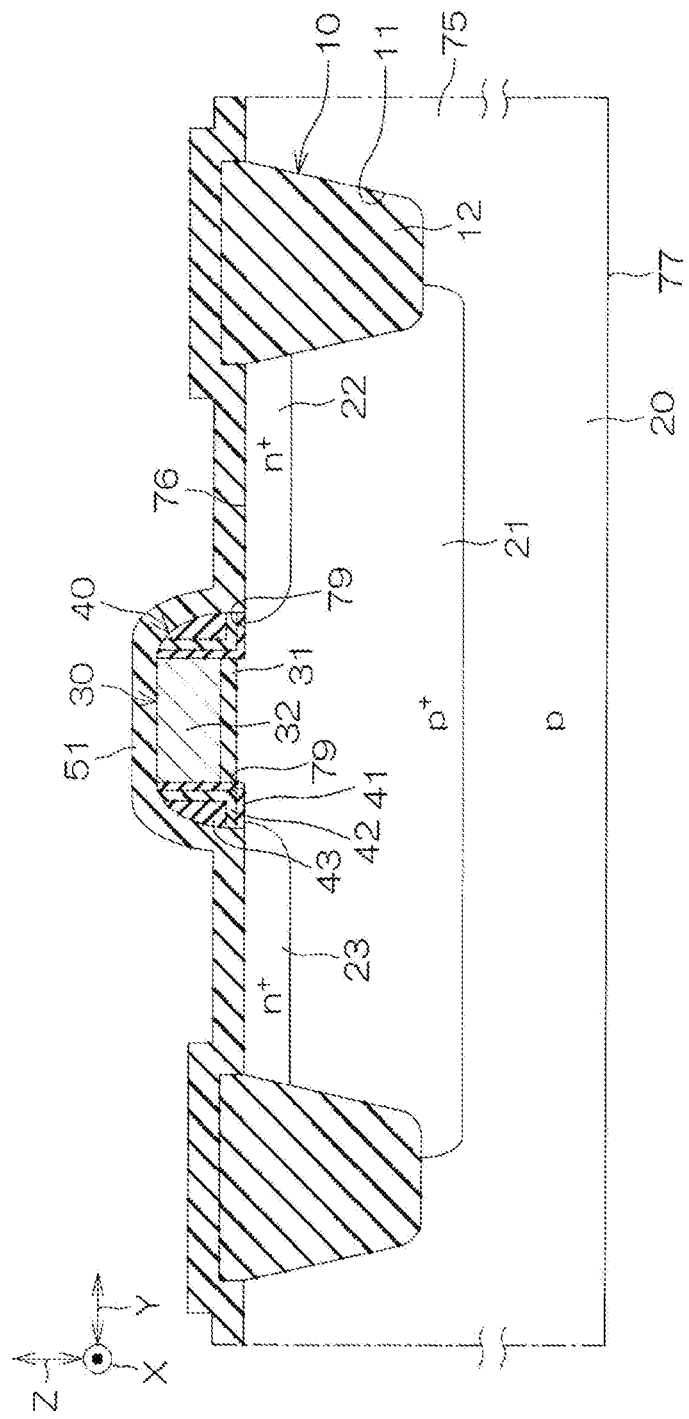
FIG. 7P is a cross-sectional view showing a process after FIG. 7O.

Referring subsequently to FIG. 7P, the covering insulating film 51 is formed on the device region 6 and the insulating buried object 12. The covering insulating film 51 is formed of silicon oxide in the present embodiment. The covering insulating film 51 may be formed by a CVD method.

Figure 7Q:
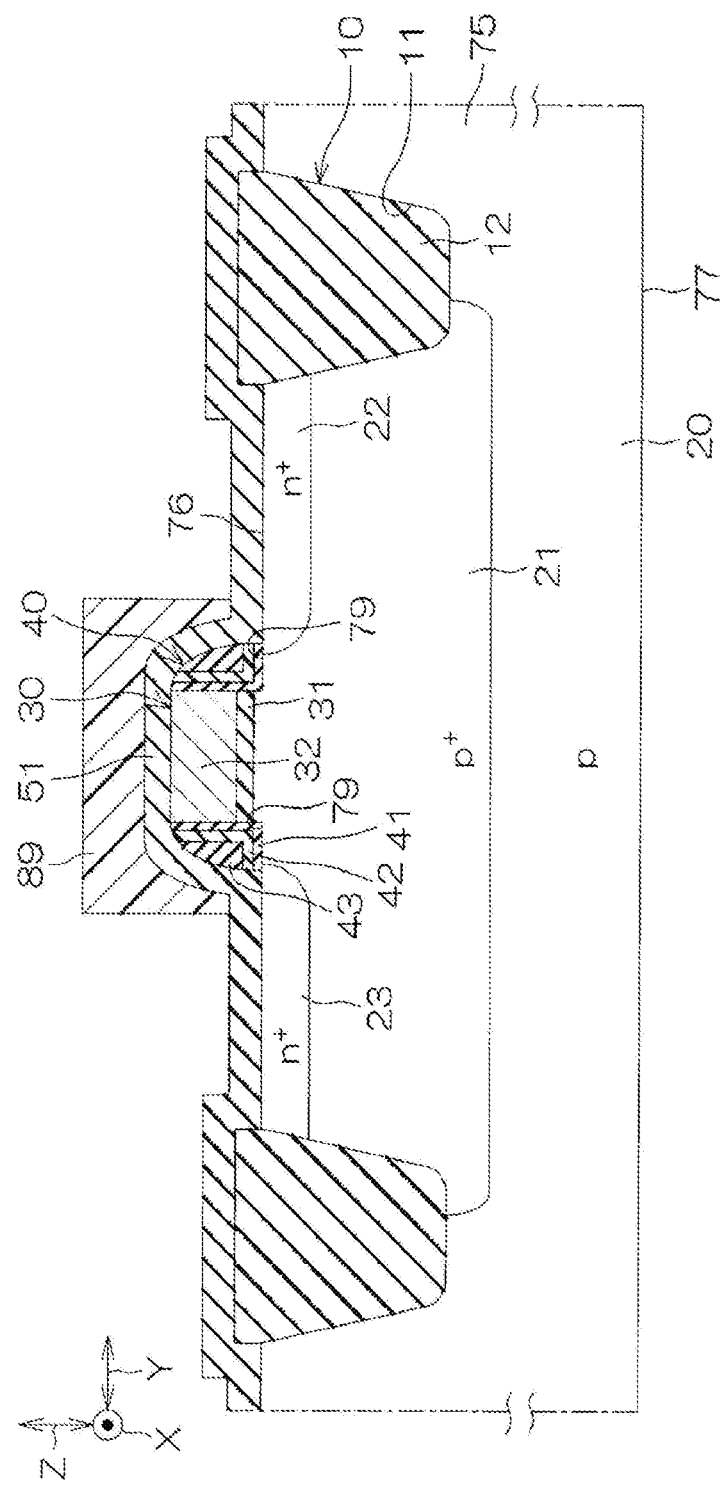
FIG. 7Q is a cross-sectional view showing a process after FIG. 7P.

Referring subsequently to FIG. 7Q, a resist mask 89 having a predetermined pattern is formed on the covering insulating film 51. The resist mask 89 exposes unnecessary portions of the covering insulating film 51 and covers other regions. Subsequently, the unnecessary portions of the covering insulating film 51 are removed by an etching method via the resist mask 89.

Specifically, as shown in FIG. 7R, a portion that covers the planar gate structure 30 and the memory structure 40 and a portion that covers the device region 6 on the lateral side of the memory structure 40 remain in the covering insulating film 51. In the covering insulating film 51, the portion covering the gate electrode 32 outside the device region 6 is removed to form the through-hole 52A. The etching method may be a dry etching method (e.g., an RIE method) and/or a wet etching method. Thereafter, the resist mask 89 is removed.

Figure 7S:
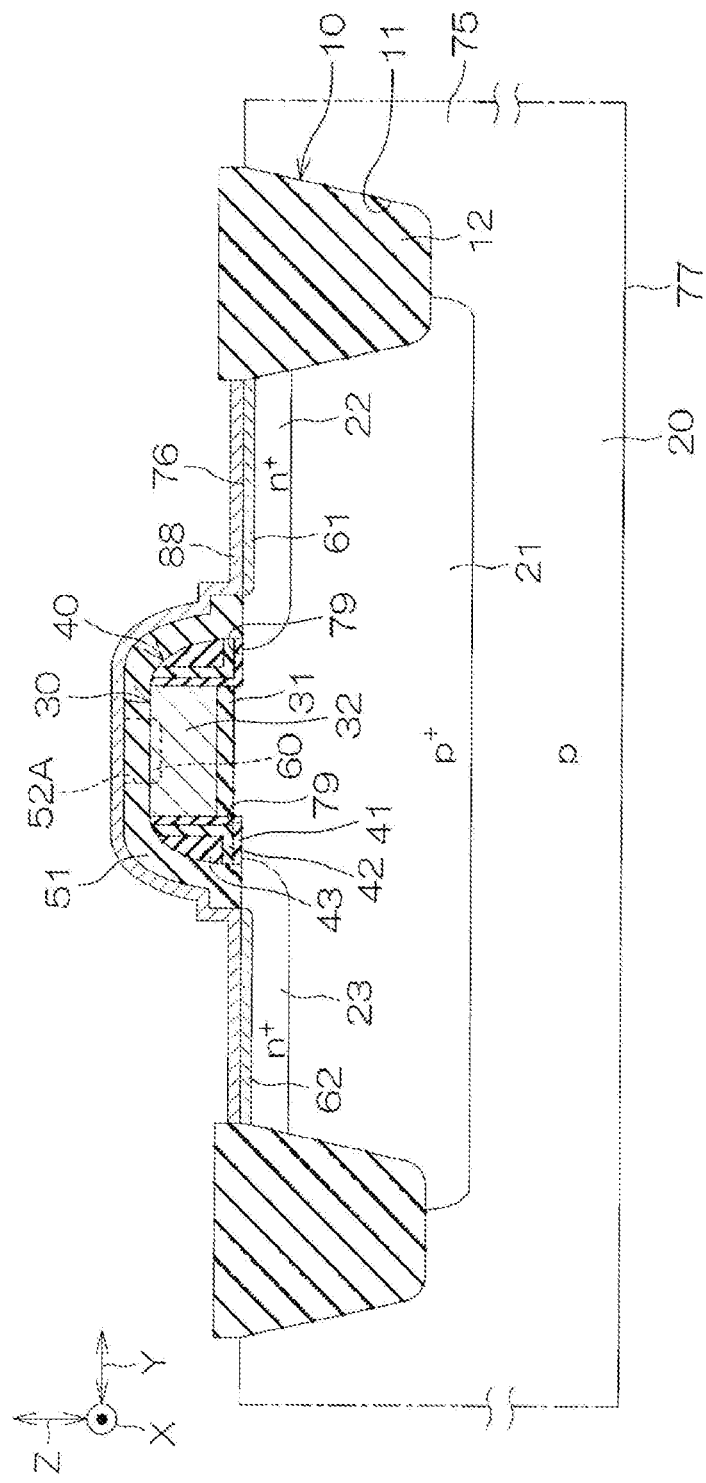
FIG. 7S is a cross-sectional view showing a process after FIG. 7R.

Referring subsequently to FIG. 7S, the gate silicide film 60, the source silicide film 61, and the drain silicide film 62 are formed. In this process, first, a metal film 88 covering the first wafer main surface 76 and the gate electrode 32 is formed in the device region 6. The metal film 88 contains at least one of Ti, Ni, Co, Mo, and W. The metal film 88 may be formed by a sputtering method or a vapor deposition method.

Subsequently, the gate electrode 32 and the portion of the first wafer main surface 76 in contact with the metal film 88 are converted into silicide. The conversion to silicide may be carried out by an annealing method (e.g., an RTA (rapid thermal anneal) method). As a result, the gate silicide film 60, the drain silicide film 62, and the source silicide film 61, each of which contains at least one of $TiSi$, $TiSi_2$, $NiSi$, $CoSi$, $CoSi_2$, $MoSi_2$, and $WSi_2$, are formed. The metal film 88 is then removed.

Figure 7T:
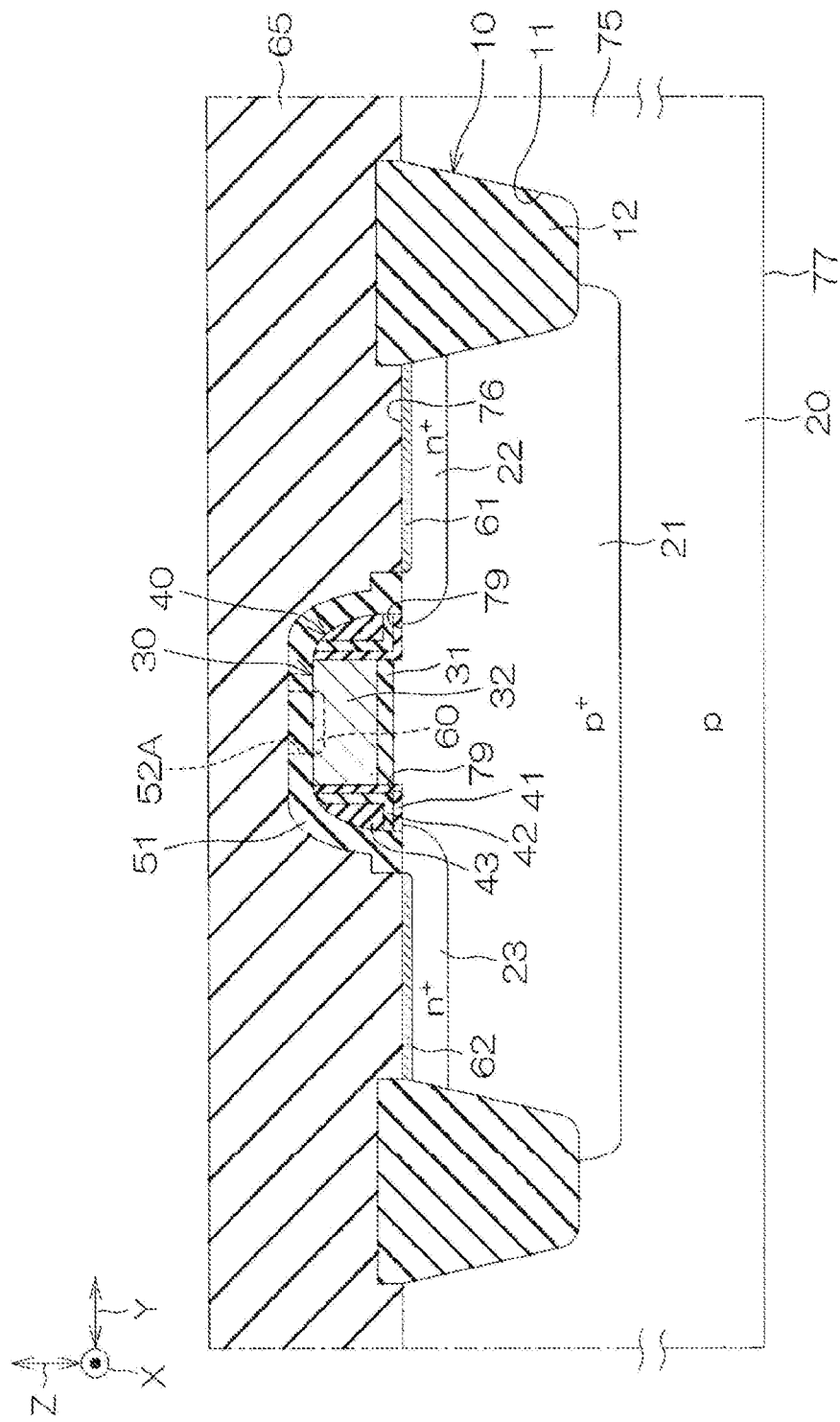
FIG. 7T is a cross-sectional view showing a process after FIG. 7S.

Referring subsequently to FIG. 7T, the interlayer insulating film 65 is formed on the first wafer main surface 76. The interlayer insulating film 65 includes at least one of an oxide film and a nitride film. The interlayer insulating film 65 may be formed by a CVD method. The interlayer insulating film 65 covers the trench isolation structure 10 and the planar gate structure 30 on the first wafer main surface 76.

Figure 7U:
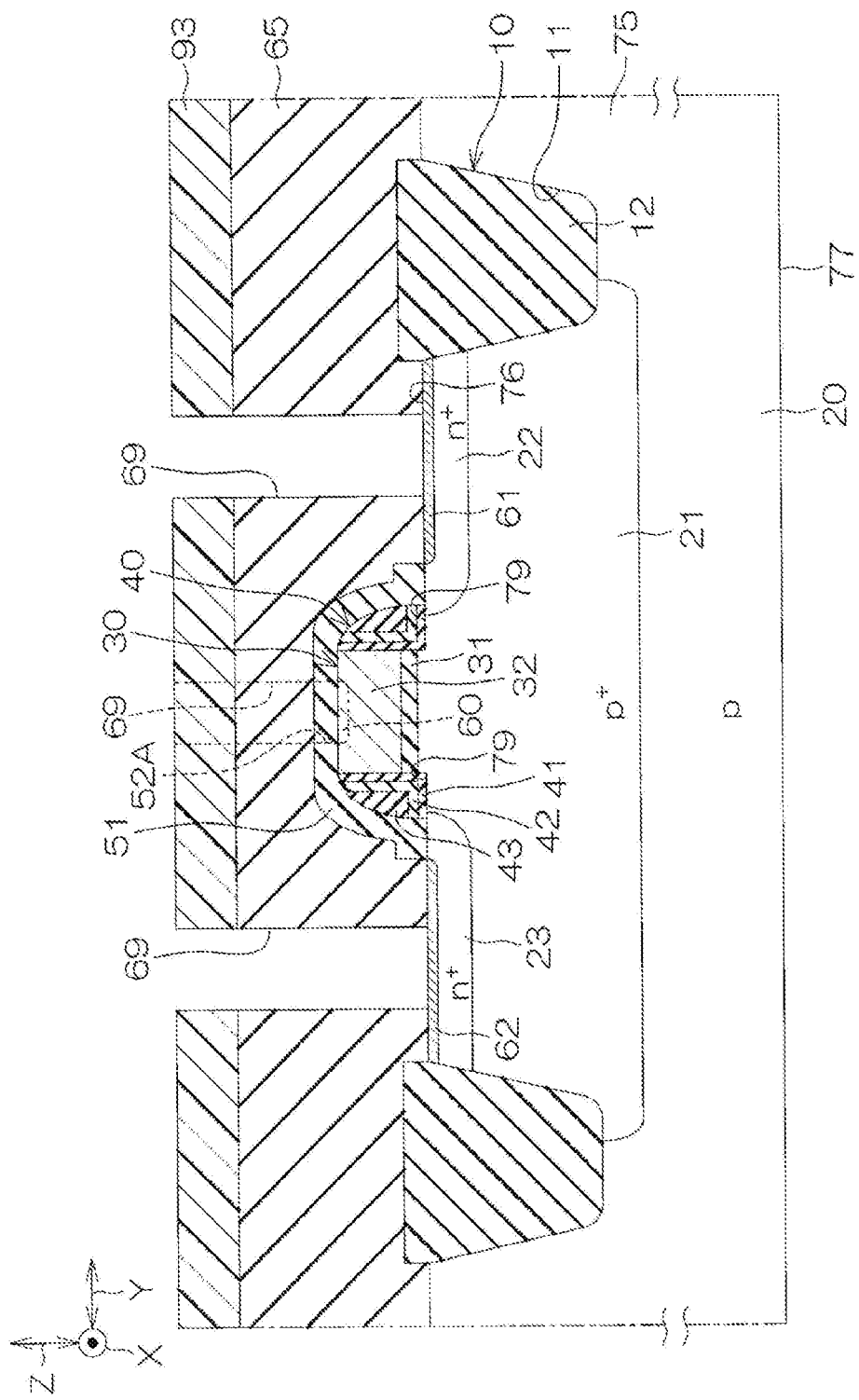
FIG. 7U is a cross-sectional view showing a process after FIG. 7T.

Referring subsequently to FIG. 7U, a resist mask 93 having a predetermined pattern is formed on the interlayer insulating film 65. The resist mask 93 exposes regions of the interlayer insulating film 65 in which the plurality of contact holes 69 is to be formed, and covers other regions. Subsequently, unnecessary portions of the interlayer insulating film 65 are removed by an etching method via the resist mask 93. The etching method may be a dry etching method (e.g., an RIE method) and/or a wet etching method. As a result, the plurality of contact holes 69 is formed in the interlayer insulating film 65 at locations corresponding to the gate electrode 32, the source region 22, and the drain region 23, respectively. The contact hole 69 corresponding to the gate electrode 32 is in communication with the through-hole 52A penetrating the covering insulating film 51. The resist mask 93 is then removed.

Figure 7V:
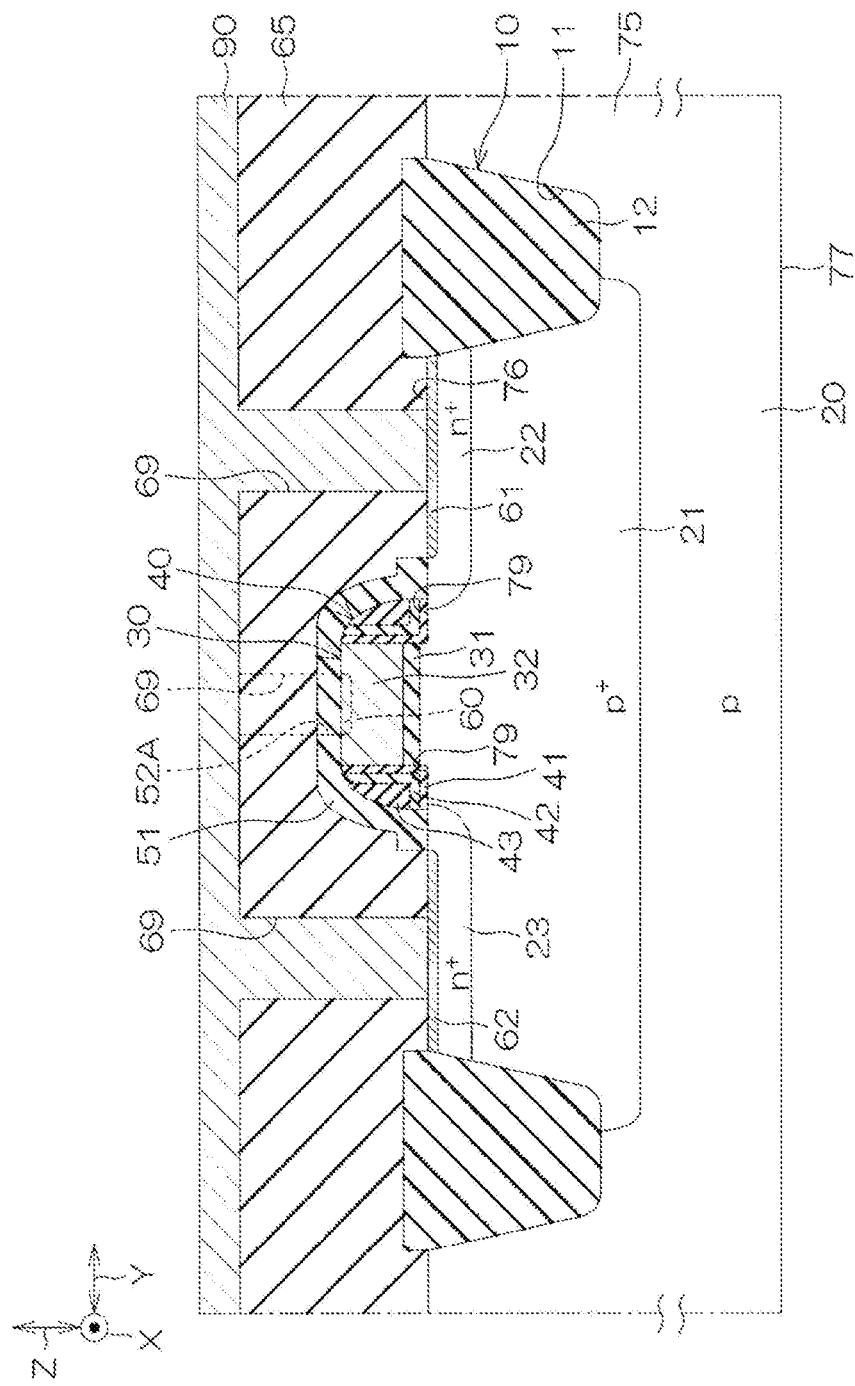
FIG. 7V is a cross-sectional view showing a process after FIG. 7U.

Referring subsequently to FIG. 7V, a base contact electrode film 90, which serves as bases of the gate contact electrode 66, the drain contact electrode 68, and the source contact electrode 67, is formed on the interlayer insulating film 65 by filling the plurality of contact holes 69. The base contact electrode film 90 may be formed by a sputtering method or a vapor deposition method.

Figure 7W:
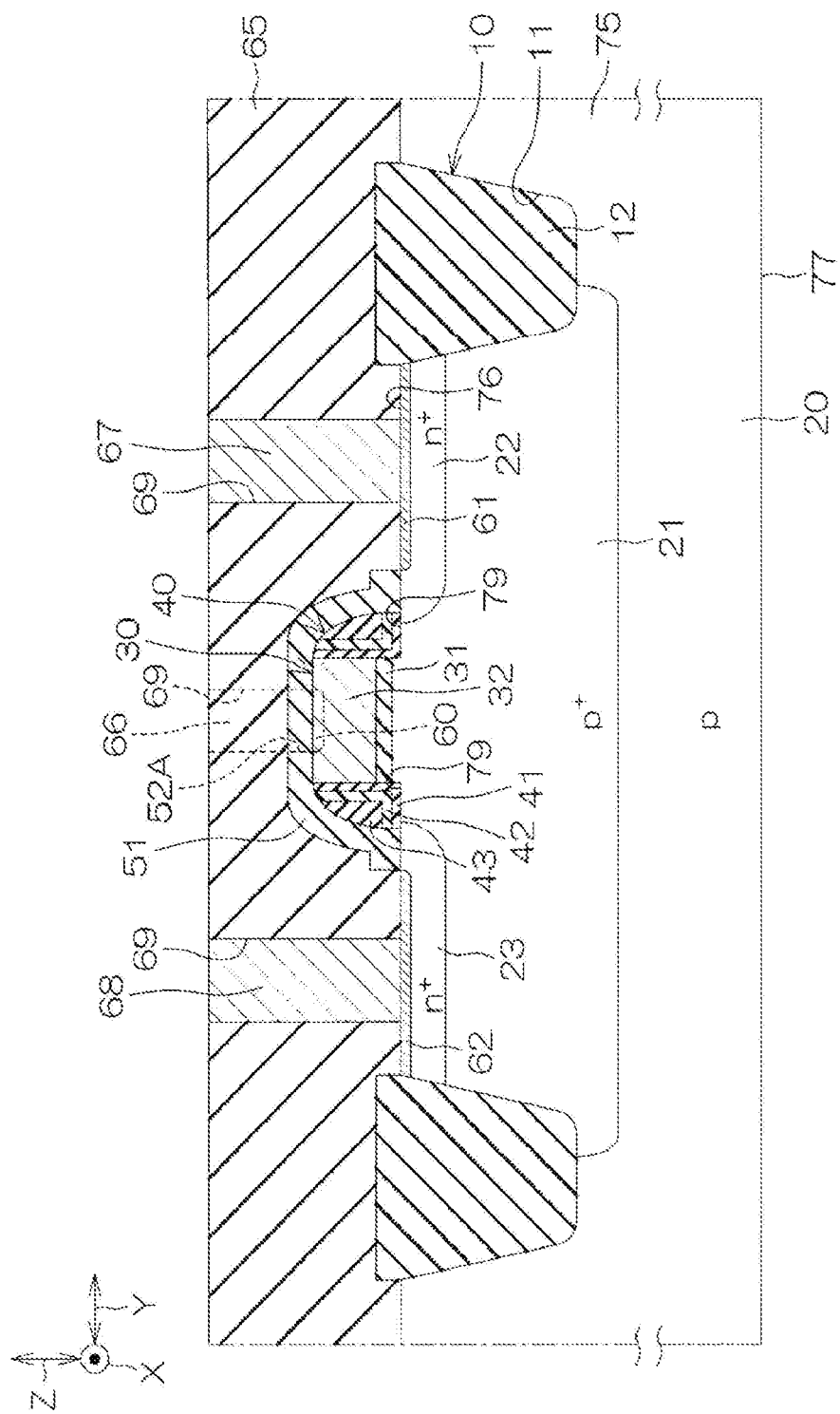
FIG. 7W is a cross-sectional view showing a process after FIG. 7V.

Referring subsequently to FIG. 7W, unnecessary portions of the base contact electrode film 90 are removed by an etching method. The base contact electrode film 90 is removed until the interlayer insulating film 65 is exposed. The etching method may be a dry etching method (e.g., an RIE method) and/or a wet etching method. As a result, the gate contact electrode 66, the drain contact electrode 68, and the source contact electrode 67 are formed.

Figure 7X:
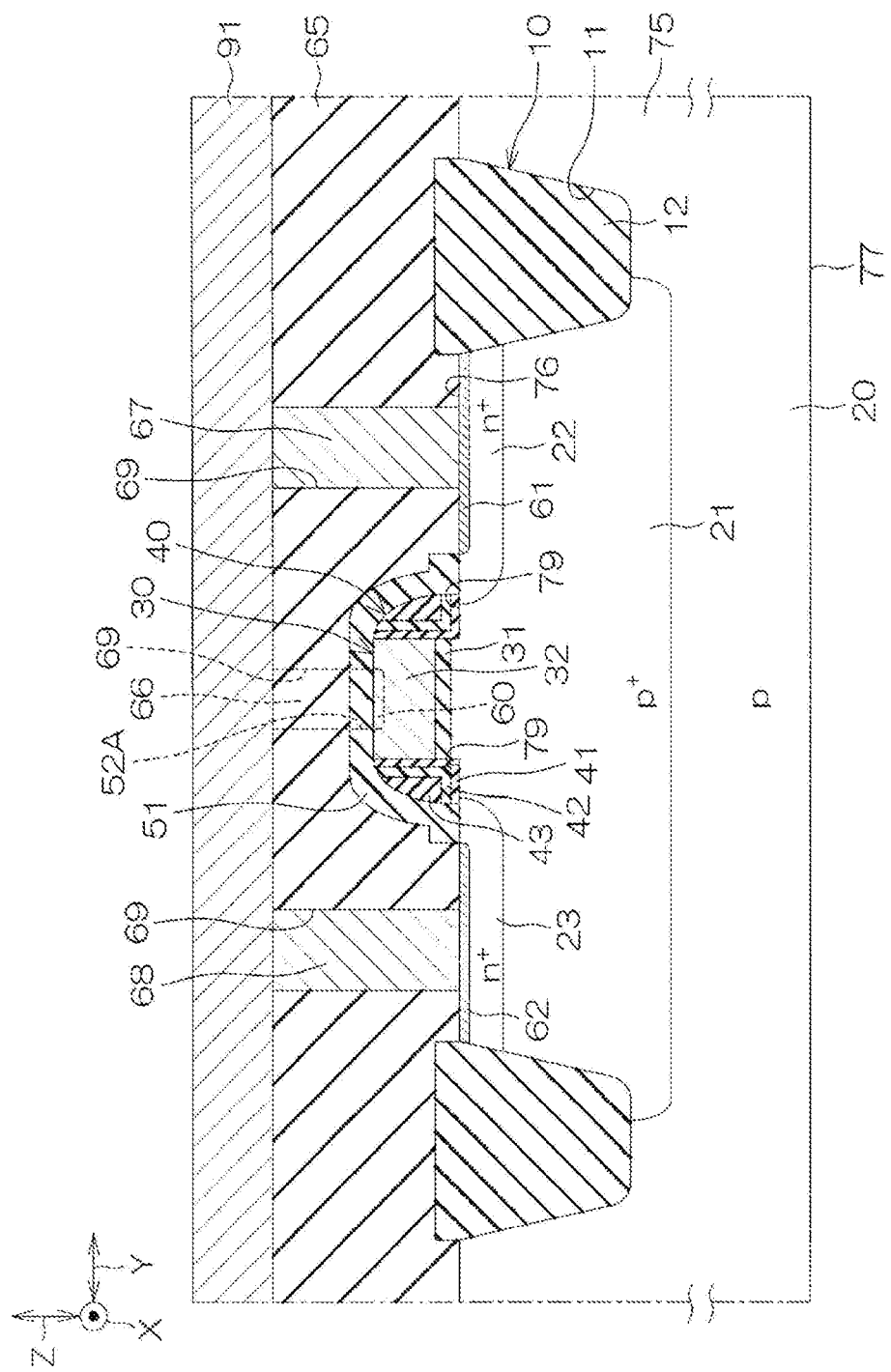
FIG. 7X is a cross-sectional view showing a process after FIG. 7W.

Referring subsequently to FIG. 7X, a base wiring film 91, which serves as bases of the gate wiring 70, the drain wiring 72, and the source wiring 71, is formed on the interlayer insulating film 65. The base wiring film 91 may be formed by a sputtering method or a vapor deposition method.

Referring subsequently to FIG. 7Y, a resist mask 92 having a predetermined pattern is formed on the base wiring film 91. The resist mask 92 covers regions of the interlayer insulating film 65 where the gate wiring 70, the drain wiring 72, and the source wiring 71 are to be formed, and exposes other regions.

Subsequently, unnecessary portion of the base wiring film 91 are removed by an etching method via the resist mask 92. The etching method may be a dry etching method (e.g., an RIE method) and/or a wet etching method. As a result, the gate wiring 70, the source wiring 71, and the drain wiring 72 are formed on the interlayer insulating film 65. The resist mask 92 is then removed. Thereafter, the semiconductor wafer 75 is cut into a plurality of semiconductor devices 1. The semiconductor device 1 is manufactured through the process including the processes described above.

According to the manufacturing method described above, the memory structure 40 is formed in a self-aligned manner without using a resist mask. Therefore, efficiency of forming the memory structure 40 can be improved as compared with a method of forming a memory structure using a resist mask.

The present disclosure is not limited to the embodiment described above, and may be implemented in other embodiments.

For example, in the above-described embodiment, the n-type (first polarity type) MOSFET including the p-type well region 21, the n-type source region 22, and the n-type drain region 23 is formed. However, unlike the above-described embodiment, a p-type (second polarity type) MOSFET including an n-type well region 21, a p-type source region 22, and a p-type drain region 23 may be formed.

In addition, various changes may be made within the scope of the claims.

According to the present disclosure, a charge storage film of a memory structure faces a channel region. Therefore, hot carriers (hot electrons and hot holes) can be easily generated. Thus, hot electrons can be injected into the charge storage film during a write operation, and hot holes can be drawn into the charge storage film during an erase operation. Accordingly, it is possible to efficiently repeat operations of writing and erasing data with respect to the memory structure.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device, comprising:
    a semiconductor layer having a main surface;
    a first conductive type well region formed on a surface portion of the main surface of the semiconductor layer;
    a second conductive type source region formed on a surface portion of the well region;
    a second conductive type drain region formed on the surface portion of the well region at an interval from the source region;
    a planar gate structure that is formed on the main surface of the semiconductor layer so as to face a first conductive type channel region disposed between the source region and the drain region, and includes a gate insulating film formed on the main surface of the semiconductor layer and a gate electrode formed on the gate insulating film;
    a memory structure disposed adjacent to a lateral side of the planar gate structure, and including an insulating film formed on the channel region and a charge storage film facing the channel region with the insulating film interposed between the charge storage film and the channel region;
    a covering insulating film that covers the planar gate structure and the memory structure; and
    an interlayer insulating film that covers the covering insulating film,
    wherein the covering insulating film is in contact with the source region and the drain region,
    wherein the covering insulating film is in contact with the gate electrode, and
    wherein the interlayer insulating film is in contact with the covering insulating film in both a direction in which the gate insulating film, the gate electrode, and the covering insulating film are stacked, and a direction in which the memory structure is disposed adjacent to the lateral side of the planar gate structure.

2. The semiconductor device of claim 1, wherein the memory structure is configured to inject hot electrons into the charge storage film during a write operation and to draw hot holes into the charge storage film during an erase operation.

3. The semiconductor device of claim 1, wherein a thickness of the insulating film of the memory structure is smaller than a thickness of the gate insulating film.

4. The semiconductor device of claim 1, wherein a recess for causing the main surface of the semiconductor layer to be recessed is provided on a lateral side of the gate insulating film, and
    wherein the insulating film of the memory structure is formed on the main surface of the semiconductor layer in the recess so as to be adjacent to the gate insulating film.

5. The semiconductor device of claim 1, wherein the memory structure is located between the source region and the planar gate structure.

6. The semiconductor device of claim 1, wherein the memory structure is located between the drain region and the planar gate structure.

7. The semiconductor device of claim 1, wherein the charge storage film is an insulator different from the insulating film of the memory structure.

8. The semiconductor device of claim 7, wherein the charge storage film is formed of SiN, and the insulating film of the memory structure is formed of $SiO_2$.

9. The semiconductor device of claim 1, wherein the charge storage film includes a first facing portion facing the channel region and a second facing portion facing the source region and the drain region.

10. The semiconductor device of claim 9, wherein the first facing portion is larger than the second facing portion in a plan view.

11. The semiconductor device of claim 1, wherein the insulating film of the memory structure includes a first insulating portion located between the semiconductor layer and the charge storage film, and a second insulating portion located between the planar gate structure and the charge storage film.

12. The semiconductor device of claim 1, wherein the charge storage film includes a first storage portion that faces the main surface of the semiconductor layer with the insulating film of the memory structure interposed between the first storage portion and the main surface of the semiconductor layer, and a second storage portion that faces the planar gate structure with the insulating film of the memory structure interposed between the second storage portion and the planar gate structure.

13. The semiconductor device of claim 12, wherein the charge storage film has a recess on a side opposite to the insulating film of the memory structure with respect to the first storage portion and on a side opposite to the insulating film of the memory structure with respect to the second storage portion, and
    wherein the memory structure further includes an insulating spacer disposed adjacent to the charge storage film in the recess.

14. The semiconductor device of claim 1, wherein the covering insulating film covers the source region and the drain region on a lateral side of the memory structure, and
    wherein the semiconductor device further comprises:

silicide films formed on surface portions of the source region and the drain region, respectively, on a side opposite to the memory structure with respect to the covering insulating film.

15. A method of manufacturing a semiconductor device, comprising:

preparing a semiconductor wafer having a first conductive type well region formed on a surface portion of a main surface of the semiconductor wafer;

forming a planar gate structure on the main surface of the semiconductor wafer, by forming a gate insulating film on the main surface of the semiconductor wafer and forming a gate electrode on the gate insulating film;

forming a memory structure, which includes an insulating film disposed on the main surface and a charge storage film disposed on the insulating film, on a lateral side of the planar gate structure;

forming a second conductive type source region on a surface portion of the well region on one side of the memory structure;

forming a second conductive type drain region on the surface portion of the well region on another side of the memory structure, such that a first conductive type channel region facing the planar gate structure and the charge storage film is formed between the second conductive type drain region and the second conductive type source region;

forming a covering insulating film to cover the planar gate structure and the memory structure; and forming an interlayer insulating film to cover the covering insulating film, wherein the covering insulating film is in contact with the source region and the drain region, wherein the covering insulating film is in contact with the gate electrode, and wherein the interlayer insulating film is in contact with the covering insulating film in both a direction in which the gate insulating film, the gate electrode, and the covering insulating film are stacked, and a direction in which the memory structure is disposed to be on the lateral side of the planar gate structure.

16. The method of claim 15, wherein forming the gate insulating film includes:

forming a first base film on a surface portion of the main surface of the semiconductor wafer; and while forming the gate insulating film, forming a recess for causing the main surface to be recessed toward a lateral side of the gate insulating film by partially removing the first base film, and wherein forming the memory structure includes forming a second base film, which serves as a base of the insulating film of the memory structure, on a surface portion of the main surface of the semiconductor wafer in the recess.

17. The method of claim 16, wherein the first base film and the second base film are formed by a thermal oxidation treatment method.

* * * * *